US011978676B2

(12) United States Patent
Chen et al.

(10) Patent No.: US 11,978,676 B2
(45) Date of Patent: May 7, 2024

(54) SEMICONDUCTOR STRUCTURE AND METHOD OF FORMING THE SAME

(71) Applicant: Taiwan Semiconductor Manufacturing Co., Ltd., Hsinchu (TW)

(72) Inventors: Szu-Ying Chen, Hsinchu (TW);
Po-Kang Ho, Taoyuan (TW);
Sen-Hong Syue, Zhubei (TW);
Huicheng Chang, Tainan (TW);
Yee-Chia Yeo, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 254 days.

(21) Appl. No.: 17/650,112

(22) Filed: Feb. 7, 2022

(65) Prior Publication Data
US 2023/0038762 A1    Feb. 9, 2023

Related U.S. Application Data

(60) Provisional application No. 63/230,115, filed on Aug. 6, 2021.

(51) Int. Cl.
*H01L 21/8238* (2006.01)
*H01L 21/02* (2006.01)
(Continued)

(52) U.S. Cl.
CPC ........... *H01L 21/823878* (2013.01); *H01L 21/02164* (2013.01); *H01L 21/02332* (2013.01);
(Continued)

(58) Field of Classification Search
CPC ....... H01L 21/823878; H01L 21/02164; H01L 21/02332; H01L 21/31116;
(Continued)

(56) References Cited

U.S. PATENT DOCUMENTS

| 2015/0004772 A1 | 1/2015 | Tsai et al. |
| 2016/0315081 A1 | 10/2016 | Park et al. |

(Continued)

FOREIGN PATENT DOCUMENTS

| DE | 102020130986 A1 | 12/2021 |
| TW | 202013457 A | 4/2020 |

(Continued)

*Primary Examiner* — Karen Kusumakar
*Assistant Examiner* — Adam S Bowen
(74) *Attorney, Agent, or Firm* — Slater Matsil, LLP

(57) ABSTRACT

A device includes a first semiconductor fin extending from a substrate, a second semiconductor fin extending from the substrate, a dielectric fin over the substrate, a first isolation region between the first semiconductor fin and the dielectric fin, and a second isolation region between the first semiconductor fin and the second semiconductor fin. The first semiconductor fin is disposed between the second semiconductor fin and the dielectric fin. The first isolation region has a first concentration of an impurity. The second isolation region has a second concentration of the impurity. The second concentration is less than the first concentration. A top surface of the second isolation region is disposed closer to the substrate than a top surface of the first isolation region.

20 Claims, 28 Drawing Sheets

(51) Int. Cl.
*H01L 21/311* (2006.01)
*H01L 21/762* (2006.01)
*H01L 27/092* (2006.01)

(52) U.S. Cl.
CPC .. *H01L 21/31116* (2013.01); *H01L 21/76224* (2013.01); *H01L 21/823821* (2013.01); *H01L 27/0924* (2013.01)

(58) Field of Classification Search
CPC ....... H01L 21/76224; H01L 21/823821; H01L 27/0924; H01L 21/76229
See application file for complete search history.

(56) References Cited

U.S. PATENT DOCUMENTS

| | | |
|---|---|---|
| 2019/0103304 A1 | 4/2019 | Lin et al. |
| 2020/0058649 A1* | 2/2020 | Ching ............. H01L 21/823418 |
| 2020/0075342 A1 | 3/2020 | Chen et al. |
| 2020/0105583 A1 | 4/2020 | Wang et al. |
| 2020/0105876 A1 | 4/2020 | Ting et al. |
| 2021/0118876 A1 | 4/2021 | Lin et al. |

FOREIGN PATENT DOCUMENTS

| | | |
|---|---|---|
| TW | 202115902 A | 4/2021 |
| TW | 202118005 A | 5/2021 |

\* cited by examiner

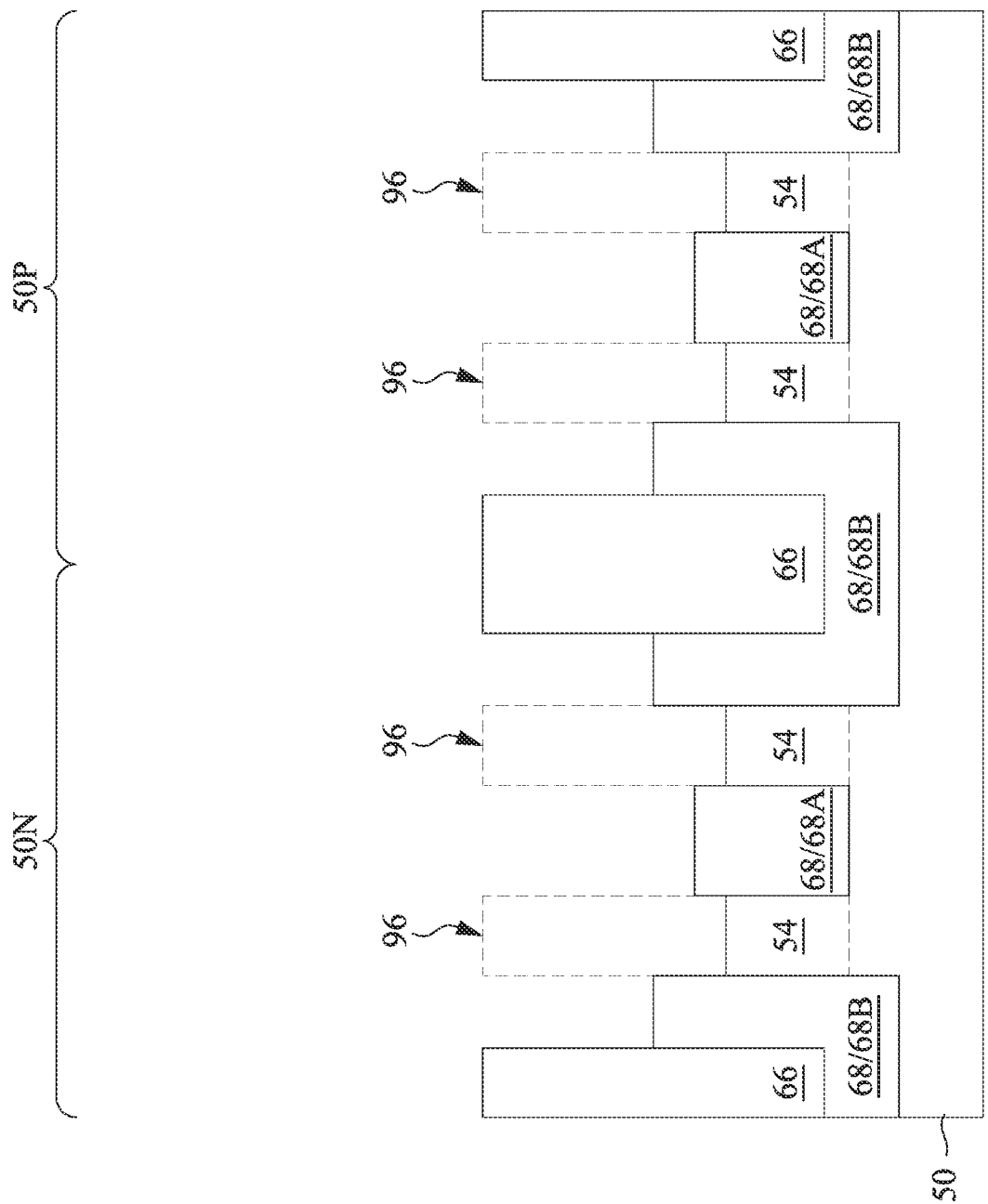

US 11,978,676 B2

SEMICONDUCTOR STRUCTURE AND METHOD OF FORMING THE SAME

PRIORITY CLAIM AND CROSS-REFERENCE

This application claims the benefit of U.S. Provisional Application No. 63/230,115, filed on Aug. 6, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
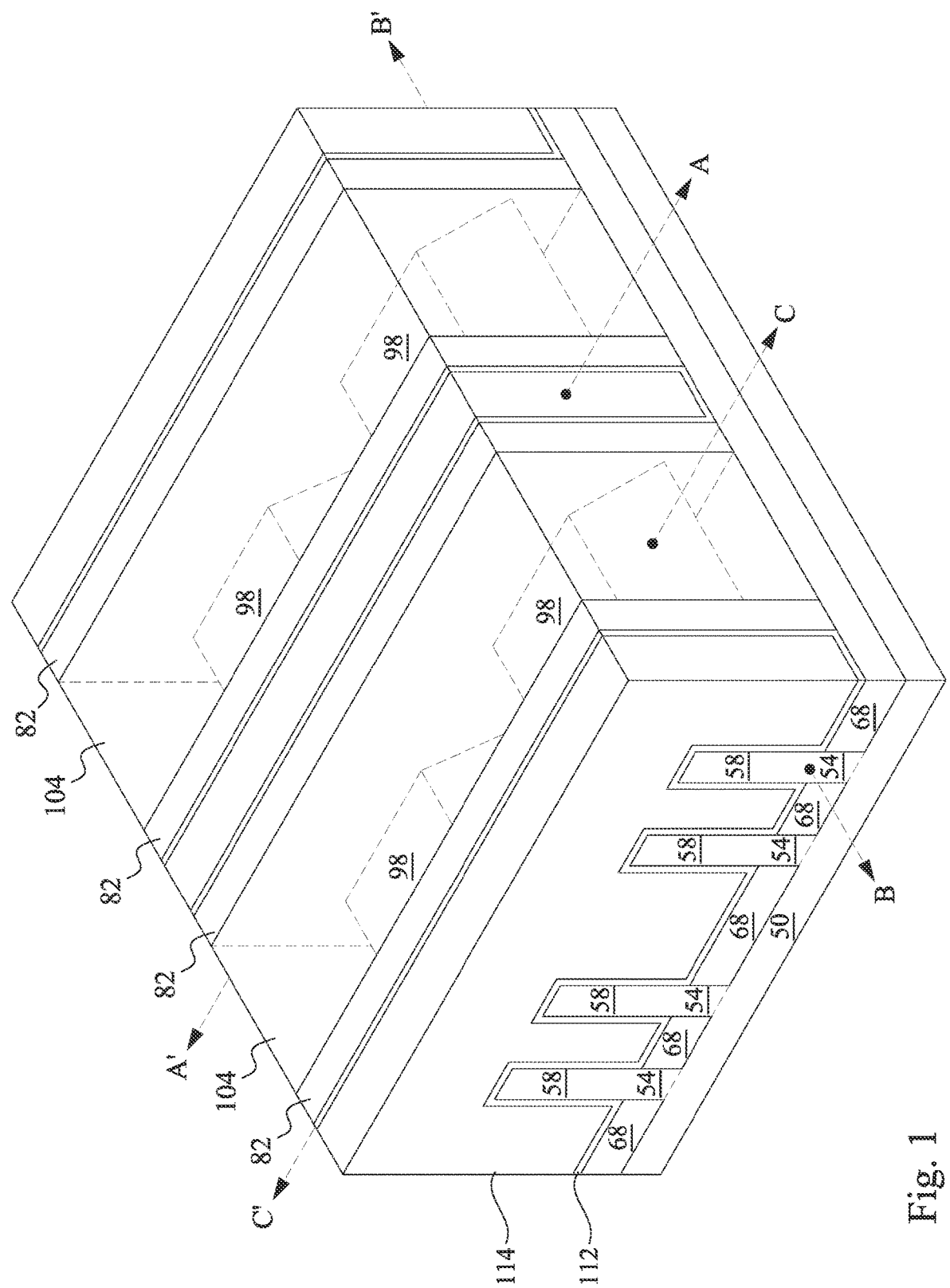
FIG. 1 illustrates an example of Fin Field-Effect Transistors (FinFETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, isolation regions having an impurity are formed between semiconductor fins and dielectric fins. A concentration of the impurity is greater in the isolation regions between the dielectric fins and the semiconductor fins than in the isolation regions among the semiconductor fins. The isolation regions are recessed with an etch that is selective to the impurity. This leads to greater etch selectivity of the isolation regions among the semiconductor fins as compared to the isolation regions between the dielectric fins and the semiconductor fins, so that the isolation regions among the semiconductor fins may be recessed deeper than the isolation regions between the dielectric fins and the semiconductor fins. Forming isolation regions that are recessed to such relative depths helps avoid bending of the semiconductor fins during processing. Avoiding bending of the semiconductor fins increases the processing window for subsequent operations, such as a replacement gate process or a source/drain growth process. Manufacturing yield of the devices may thus be improved.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include semiconductor fins 54 extending from a substrate 50 (e.g., a semiconductor substrate), with the semiconductor fins 54 acting as channel regions 58 for the FinFETs. Isolation regions 68, such as shallow trench isolation (STI) regions, are disposed between adjacent semiconductor fins 54, which may protrude above and from between adjacent isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 54 are illustrated as being single, continuous materials with the substrate 50, the bottom portions of the semiconductor fins 54 and/or the substrate 50 may include a single material or a plurality of materials. In this context, the semiconductor fins 54 refer to the portion extending from between the adjacent isolation regions 68.

Gate dielectrics 112 are along sidewalls and over top surfaces of the semiconductor fins 54. Gate electrodes 114 are over the gate dielectrics 112. Epitaxial source/drain regions 98 are disposed in opposite sides of the semiconductor fins 54 with respect to the gate dielectrics 112 and gate electrodes 114. The epitaxial source/drain regions 98 may be shared between various semiconductor fins 54. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 114. Cross-section B-B' is perpendicular to cross-section A-A' and is along a longitudinal axis of a semiconductor fin 54 and in a direction of, for example, a current flow between the epitaxial source/drain regions 98 of a FinFET. Cross-section C-C' is parallel to cross-section A-A' and extends through epitaxial source/drain regions 98 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2-17C are views of intermediate stages in the manufacturing of FinFETs, in accordance with some embodiments. FIGS. 2, 3, 4, 5, 6, 7, 8, 9A, 10A, 11A, 12A, 13A, 14A, 15A, 16A, and 17A are cross-sectional views illustrated along a similar cross-section as reference cross-section A-A' in FIG. 1. FIGS. 9B, 10B, 11B, 12B, 13B, 14B, 15B, 16B, and 17B are cross-sectional views illustrated along a similar cross-section as reference cross-section B-B' in FIG. 1. FIGS. 9C, 10C, 11C, 12C, 13C, 14C, 15C, 16C, and 17C are cross-sectional views illustrated along a similar cross-section as reference cross-section C-C' in FIG. 1.

Figure 2:
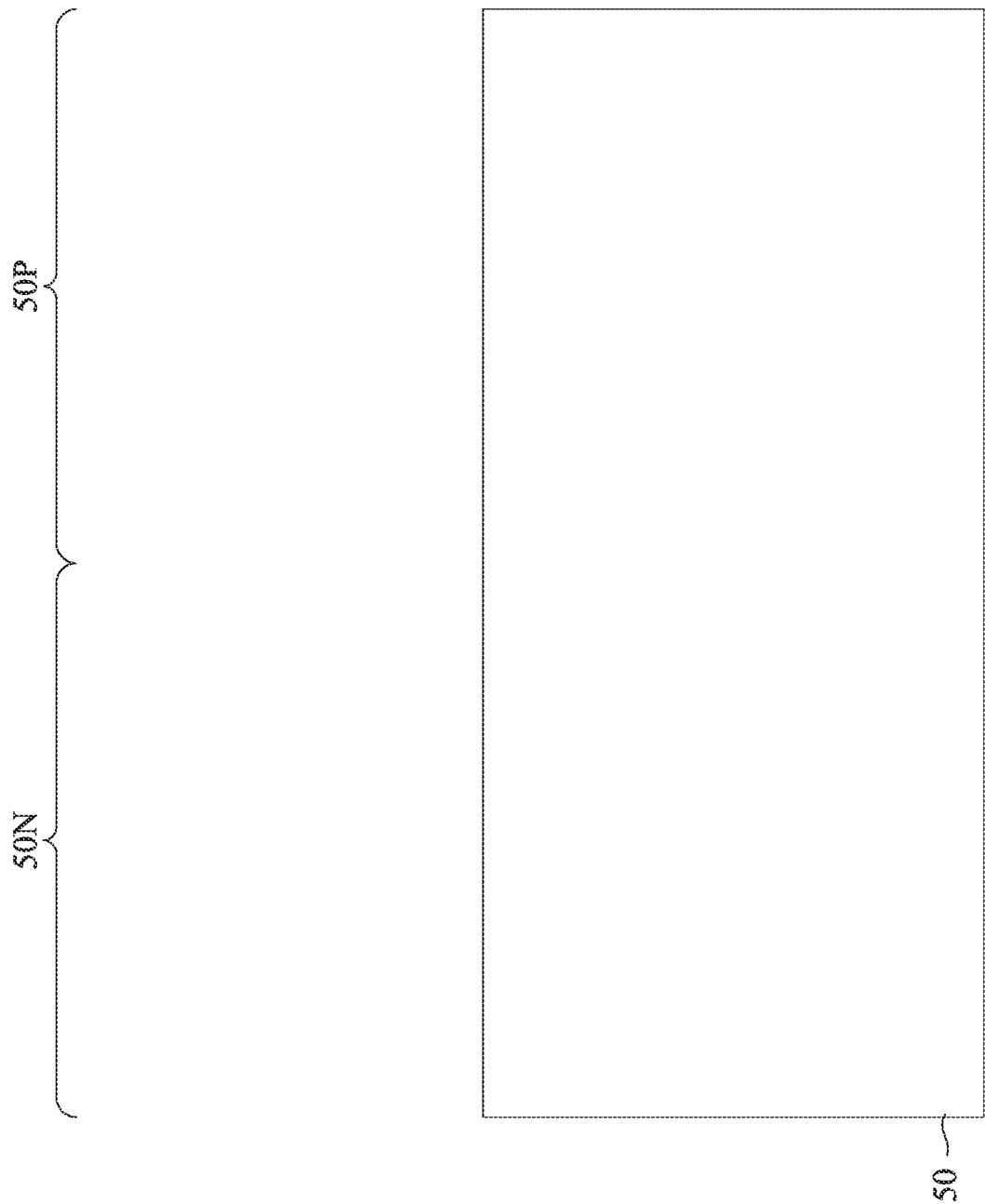
FIGS. 2-17C are views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type FinFETs, and the p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Figure 3:
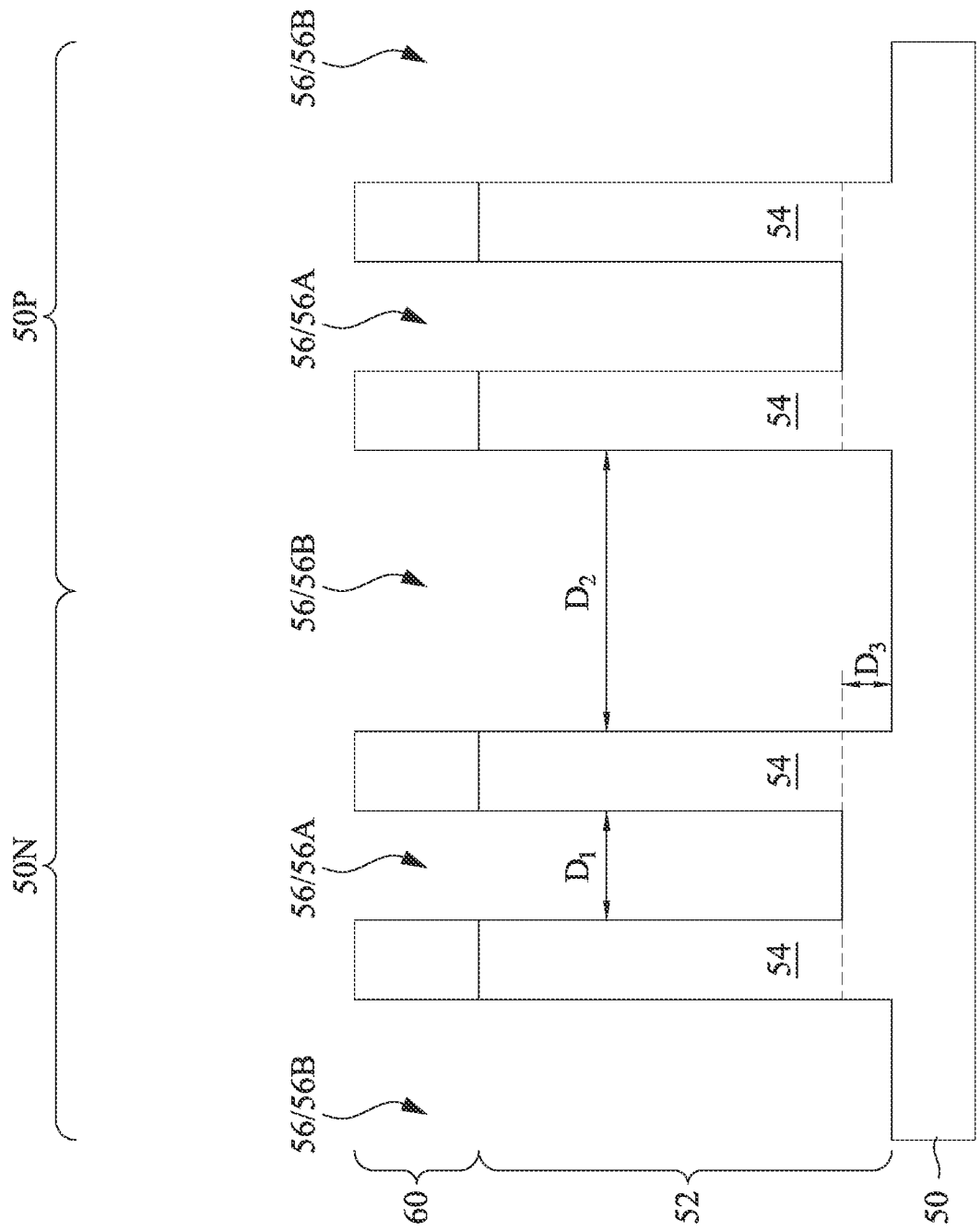

In FIG. 3, fin structures 52 are formed in the substrate 50. The fin structures 52 include semiconductor fins 54, which are semiconductor strips. The fin structures 52 may be formed in the substrate 50 by etching trenches 56 in the substrate 50. The etching may be any acceptable etching process, such as a reactive ion etch (RIE), neutral beam etch (NBE), the like, or a combination thereof. The etching process may be anisotropic.

The fin structures 52 may be patterned by any suitable method. For example, the fin structures 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks 60 to pattern the fin structures 52. In some embodiments, the masks 60 (or other layer) may remain on the fin structures 52.

In the illustrated embodiment, the fin structures 52 each have two semiconductor fins 54. However, the fin structures 52 may each have any quantity of the semiconductor fins 54, such as two, three, or more semiconductor fins 54. Further, different fin structures 52 may have different quantities of semiconductor fins 54. For example, fin structures 52 in a first region of a die (e.g., a core logic region) may have a first quantity of semiconductor fins 54, and fin structures 52 in a second region of the die (e.g., an input/output region) may have a second quantity of semiconductor fins 54, with the second quantity being different from the first quantity.

The trenches 56 have different widths. Specifically, a first subset of the trenches 56A have a lesser width than a second subset of the trenches 56B. The trenches 56A separate the semiconductor fins 54 of respective fin structures 52, and the trenches 56B separate the fin structures 52 from each other. The semiconductor fins 54 of respective fin structures 52 are spaced apart by a lesser distance than the fin structures 52 are spaced apart from each other. In some embodiments, the semiconductor fins 54 of respective fin structures 52 are spaced apart by a distance $D_1$ in the range of 12 nm to 30 nm, the fin structures 52 are spaced apart from each other by a distance $D_2$ in the range of 40 nm to 300 nm, and the distance $D_2$ is greater than the distance $D_1$. The trenches 56 may be formed with different widths by patterning the masks 60 with a pattern having features spaced apart by different distances that correspond to the different widths of the trenches 56. The widths of the trenches 56 defines the width of the semiconductor fins 54 (also referred to as the critical dimension of the semiconductor fins 54). In some embodiments, the semiconductor fins 54 have a critical dimension in the range of 5 nm to 10 nm.

The trenches 56 have different depths. Specifically, the trenches 56A have a lesser depth than the trenches 56B. In some embodiments, the trenches 56A have a first depth in the range of 90 nm to 130 nm, the trenches 56B have a second depth in the range of 100 nm to 150 nm, and the second depth is greater than the first depth. In some embodiments, a difference in distance $D_3$ between the depths of the trenches 56A and the trenches 56B is in the range of 10 nm to 30 nm. The trenches 56 may be formed with different depths as a result of pattern loading effects during etching of the trenches 56, with the pattern loading effects caused by the pattern of the masks 60 having features spaced apart by different distances. The depths of the trenches 56 defines the height of the semiconductor fins 54. In some embodiments, the semiconductor fins 54 have a height in the range of 90 nm to 130 nm.

FIGS. 4 through 7 illustrate a process in which STI regions 68 (see FIG. 7) are formed having different heights. As shown below in FIG. 7, a first subset of the STI regions 68A disposed between semiconductor fins 54 and dielectric fins 66 have a greater height than a second subset of the STI regions 68B disposed between neighboring semiconductor fins 54. Forming the STI regions 68A to have greater heights than the STI regions 68B allows for a reduction in bending of the semiconductor fins 54, which increases the processing window for subsequent operations. The STI regions 68 are formed by depositing and recessing an insulation material 62 (see below, FIG. 4). The insulation material 62 is formed so that it has modified insulating regions 62M and unmodified insulating regions 62N (see below, FIG. 4). The respective etch rates of the modified insulating regions 62M and the unmodified insulating regions 62N are controlled by modifying concentrations of an impurity (e.g. nitrogen) in the modified insulating regions 62M more than in the unmodified insulating regions 62N. An etching process used to recess the insulation material 62 may thus recess the unmodified insulating regions 62N more than the modified insulating regions 62M. By controlling the respective etch rates in the modified insulating regions 62M and the unmodified insulating regions 62N, different heights of the STI regions 68A and 68B are achieved.

Figure 4:
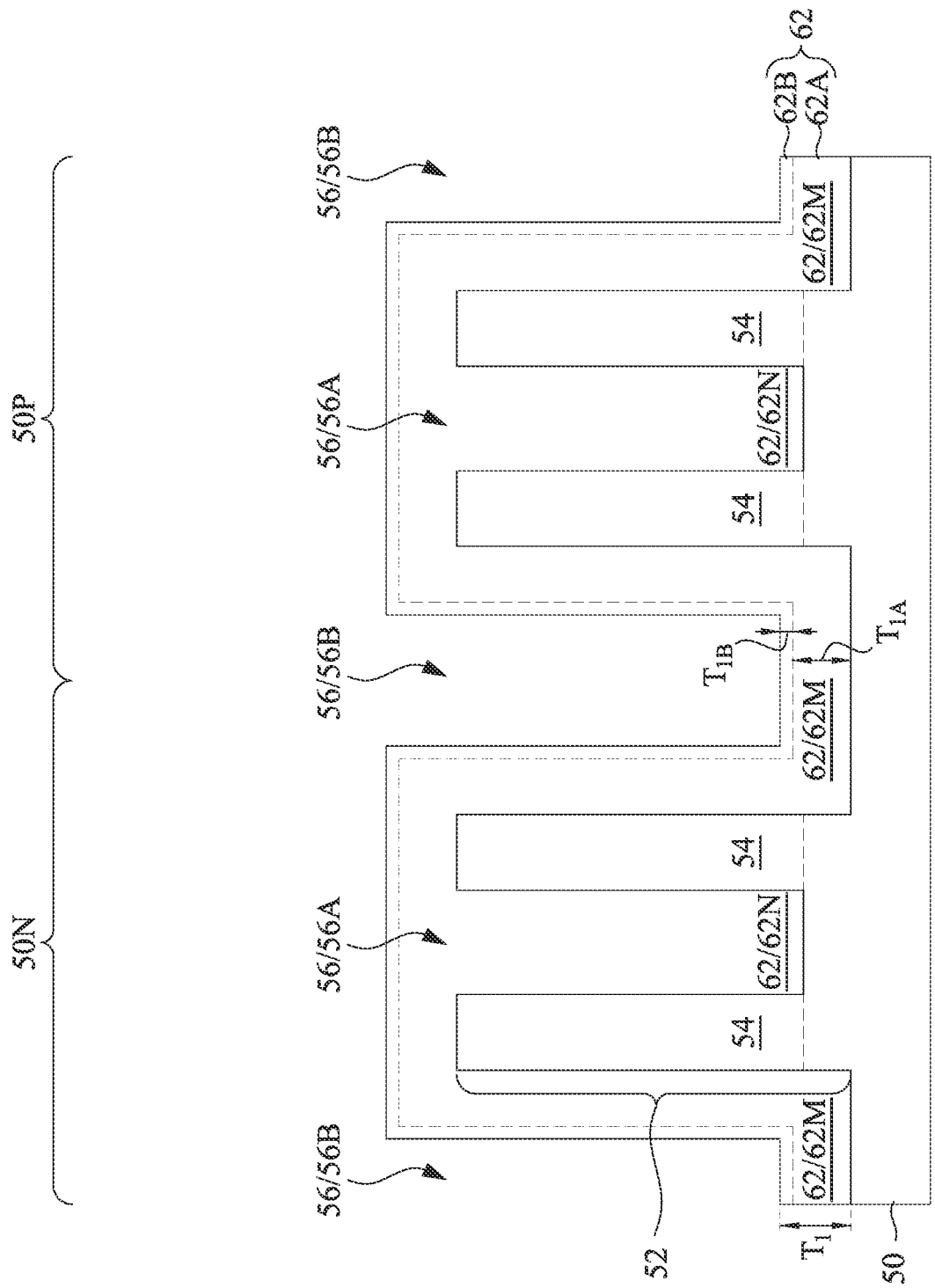

In FIG. 4, an insulation material 62 for isolation regions is formed over the substrate 50 and between adjacent semiconductor fins 54. The insulation material 62 includes a first insulating layer 62A on the substrate 50, and a second insulating layer 62B on the first insulating layer 62A. As will be subsequently described in greater detail, the insulation material 62 is formed by depositing the first insulating layer 62A, depositing the second insulating layer 62B, and then annealing the first insulating layer 62A and the second insulating layer 62B so as to drive an impurity (e.g., nitrogen) into the first insulating layer 62A. As such, the insulation material 62 includes modified insulating regions 62M and unmodified insulating regions 62N, which have different etch rates relative an etching process used to recess the insulation material 62.

The first insulating layer 62A (which may also be referred to as a first insulating film) is formed of a first insulating material, which may include an oxide, such as silicon oxide; a nitride, such as silicon nitride, silicon oxynitride, silicon oxycarbide, silicon carbonitride, or silicon oxycarbonitride; the like; or a combination thereof, which may be formed by chemical vapor deposition (CVD), a high density plasma chemical vapor deposition (HDP-CVD), a flowable CVD (FCVD), atomic layer deposition (ALD), the like, or a combination thereof. In some embodiments, the first insulating layer 62A is silicon oxide that is formed with FCVD. Other insulation materials formed by any acceptable process may be used. In an embodiment, the first insulating layer 62A is formed such that excess portions of the first insulating layer 62A cover the semiconductor fins 54.

The thickness of the first insulating layer 62A is controlled so that the insulation material 62 fills trenches 56A but does not fill trenches 56B. In some embodiments, the first insulating layer 62A is deposited to a thickness $T_{1A}$ in a range of 25 nm to 40 nm. The distances $D_1$, $D_2$ (see FIG. 3) and the thickness $T_{1A}$ are controlled so that the first insulating layer 62A fills the trenches 56A without filling the trenches 56B. For example, the dispensed volume of the first insulating layer 62A may be sufficient to completely fill (or overfill) the trenches 56A, but may be insufficient to completely fill the trenches 56B. The first insulating layer 62A in the trenches 56B thus does not completely fill the trenches 56B, but instead conformally lines the surfaces of the substrate 50 and the sidewalls of the semiconductor fins 54 that define the trenches 56B.

A first anneal process may be performed after depositing the first insulating layer 62A. In embodiments where the first insulating layer 62A is deposited by FCVD, it may be initially deposited as a flowable insulating material, and the first anneal process converts the flowable insulating material to a solid insulating material. The first anneal process may reduce the concentration of an impurity (e.g. nitrogen) in the first insulating layer 62A, such as by oxidizing the first insulating layer 62A. For example, the first anneal process may increase the atomic percentage of oxygen and may decrease the atomic percentage of nitrogen in the first insulating layer 62A. The first anneal process may be performed in an environment with an oxygen-containing process gas, such as oxygen ($O_2$), ozone ($O_3$), water vapor ($H_2O$), the like, or a combination thereof. In some embodiments, the first anneal process is performed at a temperature in a range of 200° C. to 700° C., under a pressure of 1 torr to 760 torr, and for a duration in a range of 30 seconds to 36000 seconds. After the first anneal process, a concentration of the impurity in the first insulating layer 62A is reduced to an atomic percentage of less than 1 at %, which is advantageous for controlling the relative etch rates of subsequently formed insulating regions 62M and 62N (see below).

The second insulating layer 62B (which may also be referred to as a second insulating film) is formed of a second insulating material, which may include an oxide, such as silicon oxide; a nitride, such as silicon nitride, silicon oxynitride, silicon oxycarbide, silicon carbonitride, or silicon oxycarbonitride; the like; or a combination thereof, which may be formed by chemical vapor deposition (CVD), a high density plasma chemical vapor deposition (HDP-CVD), a flowable CVD (FCVD), atomic layer deposition (ALD), the like, or a combination thereof. In some embodiments, the second insulating layer 62B is silicon oxynitride that is formed with ALD. Other insulation materials formed by any acceptable process may be used. The second insulating layer 62B has a concentration of an impurity (e.g. nitrogen) greater than the concentration of the impurity in the first insulating layer 62A, which is advantageous for controlling the relative etch rates of subsequently formed insulating regions 62M and 62N (see below). In some embodiments, the second insulating layer 62B has a concentration of the impurity (e.g. nitrogen) in a range of 0 at % to 20 at %.

The thickness of the second insulating layer 62B is controlled so that the second insulating layer 62B does not fill the trenches 56B. In some embodiments, the second insulating layer 62B is deposited to a thickness $T_{1B}$ in a range of 5 nm to 10 nm. The distances $D_1$, $D_2$ (see FIG. 3) and the thickness $T_{1B}$ are controlled so that the second insulating layer 62B is formed over sidewalls and bottom surfaces of the trenches 56B without filling the trenches 56B. The second insulating layer 62B in the trenches 56B thus does not completely fill the trenches 56B, but instead conformally lines the exposed surfaces of the first insulating layer 62A. As noted above, the first insulating layer 62A fills the trenches 56A without filling the trenches 56B. Accordingly, the second insulating layer 62B is formed in the trenches 56B, but is not formed in the trenches 56A.

In some embodiments, a second anneal process is performed after depositing the second insulating layer 62B. The second anneal process drives an impurity (e.g. nitrogen) from the second insulating layer 62B into upper portions of the first insulating layer 62A. In some embodiments, the second anneal process is performed at a temperature in a range of 200° C. to 700° C., under a pressure of 1 torr to 760 torr, and for a duration in a range of 30 seconds to 36000 seconds. After the second anneal process, the impurity is driven into upper portions of the first insulating layer 62A, so as to modify those portions of the first insulating layer 62A to have a desired concentration of the impurity. The resulting insulation material 62 thus has modified insulating regions 62M (which have an increased concentration of the impurity, e.g., nitrogen) and unmodified insulating regions 62N (which do not have an increased concentration of the impurity). Because the second insulating layer 62B is not formed in the trenches 56A, the second anneal process drives more of the impurity from the second insulating layer 62B into the modified insulating regions 62M than into the unmodified insulating regions 62N, and thus the concentration of the impurity in the modified insulating regions 62M is greater than in the unmodified insulating regions 62N. In some embodiments, the concentration of the impurity in the modified insulating regions 62M is in a range of 1 at % to 5 at %, and the concentration of the impurity in the unmodified insulating regions 62N is less than 1 at %. This is advantageous for controlling the relative etch rates of the insulating regions 62M and 62N. The concentration of the impurity being greater in the modified insulating regions 62M than in the unmodified insulating regions 62N leads to a lower etching rate of the modified insulating regions 62M than of the unmodified insulating regions 62N relative an etching process, as described below with respect to FIG. 7.

As described above, modified insulating regions 62M are formed by including portions of the second insulating layer 62B having greater concentrations of an impurity (e.g. nitrogen) over the first insulating layer 62A having a lower concentration of the impurity. Further, and as noted above, the first insulating layer 62A is formed in the trenches 56B but not in the trenches 56A. As such, the modified insulating regions 62M are formed in the trenches 56B but not in the trenches 56A. In other words, the trenches 56A contain the unmodified insulating regions 62N, and the trenches 56B contain the modified insulating regions 62M.

In the illustrated embodiment, the sidewalls of the semiconductor fins 54 and the insulation material 62 are illustrated as forming right angles with the top surfaces of the substrate 50 and the insulation material 62, respectively. In other embodiments (subsequently described for FIGS. 18-19), contouring may occur during the patterning of the semiconductor fins 54 and the deposition of the insulation material 62. Accordingly, rounded surfaces may connect the sidewalls of the semiconductor fins 54 to the top surfaces of the substrate 50, and rounded surfaces may connect the sidewalls of the insulation material 62 to the top surfaces of the insulation material 62.

Figure 5:
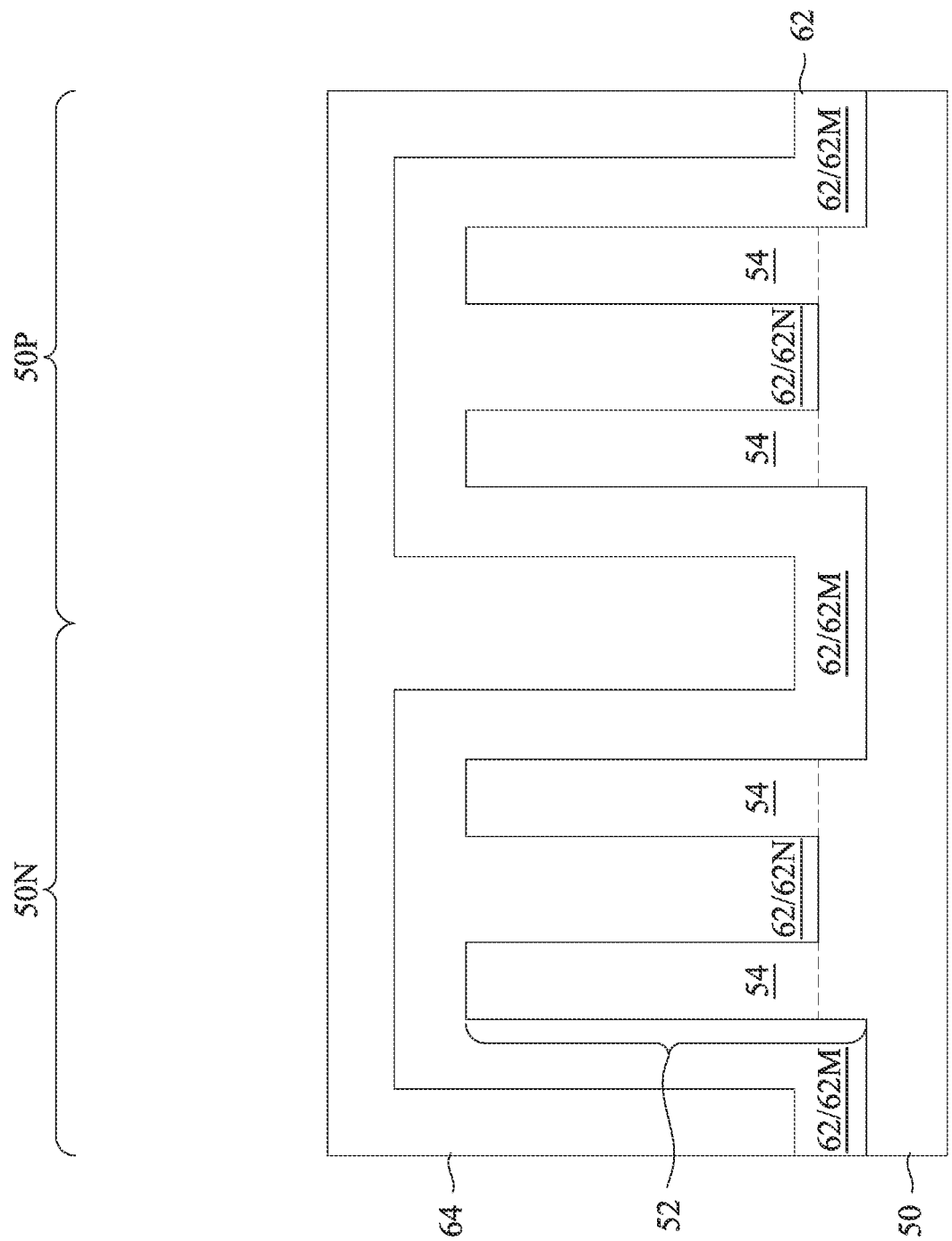

In FIG. 5, one or more dielectric layer(s) 64 are formed on the insulation material 62. The dielectric layer(s) 64 fill (and may overfill) the remaining portions of the trenches 56B that are not filled (e.g., are unoccupied) by the insulation material 62. The dielectric layer(s) 64 may be formed of one or more dielectric material(s). Acceptable dielectric materials include nitrides (e.g., silicon nitride), oxides (e.g., tantalum oxide, aluminum oxide, zirconium oxide, hafnium oxide, etc.), carbides (e.g., silicon carbonitride, silicon oxycarbonitride, etc.), combinations thereof, or the like, which may be deposited by ALD, CVD, or the like. Other insulation materials formed by any acceptable process may be used. Further, the dielectric layer(s) 64 may be formed of a low-k dielectric material (e.g., a dielectric material having a k-value less than about 3.5), a high-k dielectric material (e.g., a dielectric material having a k-value greater than about 7.0), or multi-layers thereof. The dielectric layer(s) 64 are formed of material(s) that have a high etching selectivity from the etching of the insulation material 62. In some embodiments, the dielectric layer(s) 64 include silicon nitride formed by ALD.

Figure 6:
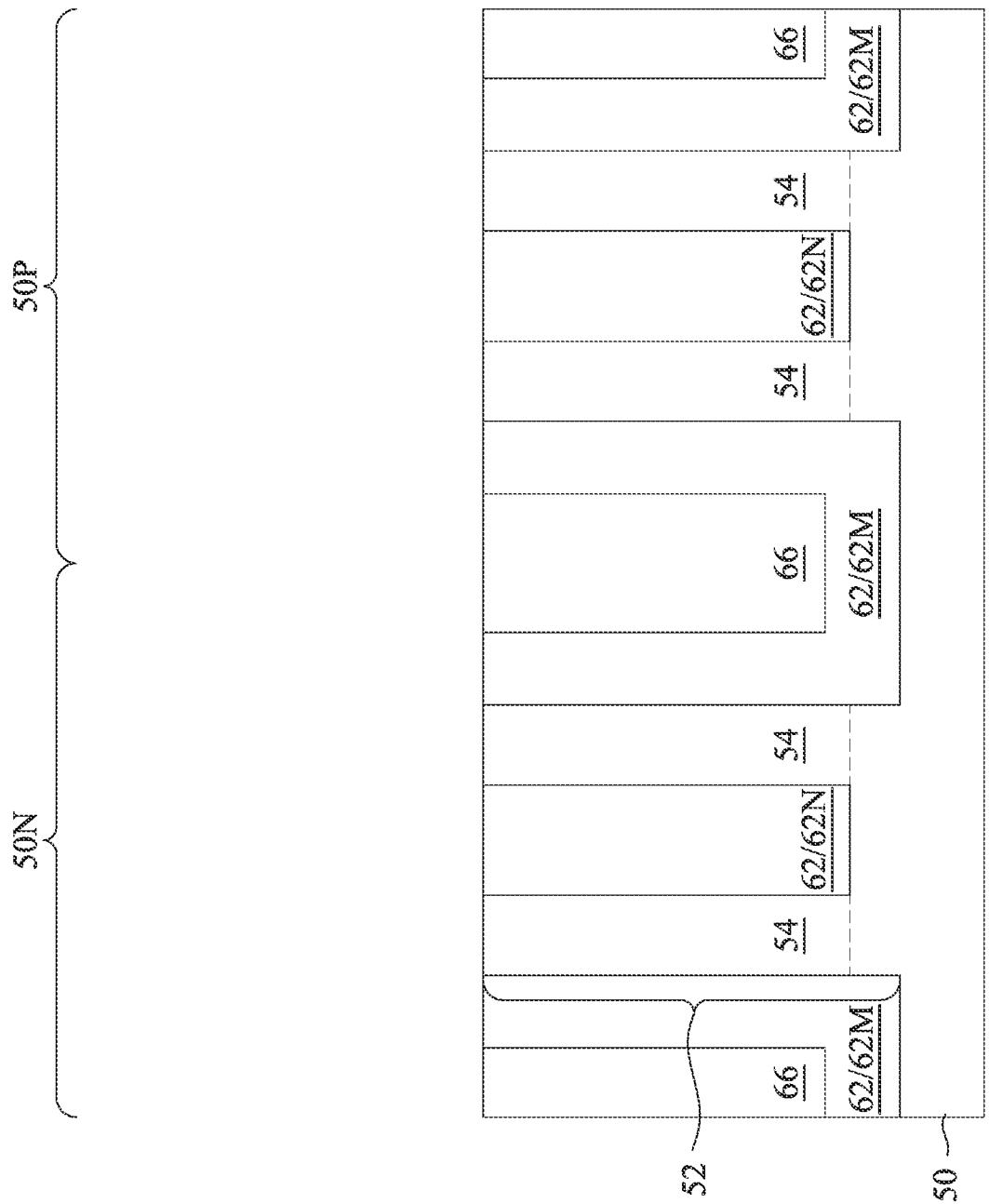

In FIG. 6, a removal process is applied to the dielectric layer(s) 64 and the insulation material 62 to remove excess portions of the dielectric layer(s) 64 and the insulation material 62 over the semiconductor fins 54 (e.g., outside of the trenches 56), thereby forming dielectric fins 66 on the insulation material 62. In some embodiments, a planarization process such as a chemical mechanical polish (CMP), an etch-back process, combinations thereof, or the like may be utilized. The dielectric layer(s) 64, after the removal process, have portions left in the trenches 56B (thus forming the dielectric fins 66). After the planarization process, the top surfaces of the dielectric fins 66, the insulation material 62, and the semiconductor fins 54 are coplanar (within process variations) such that they are level with each other. The dielectric fins 66 are disposed between and are adjacent to the fin structures 52. The dielectric fins 66 may also be referred to as "hybrid fins."

Figure 7:
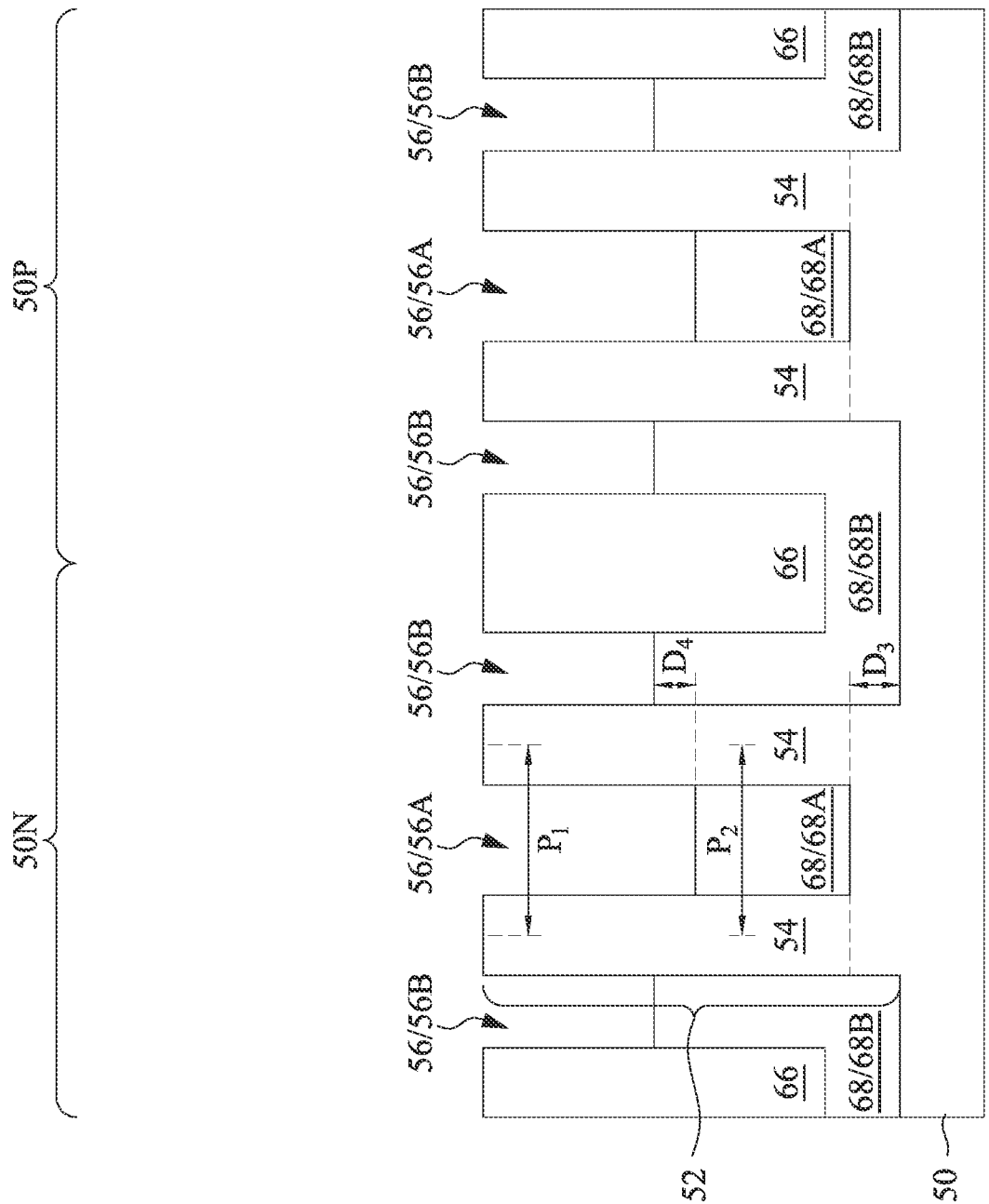

In FIG. 7, the insulation material 62 is recessed to form STI regions 68, including a first subset of the STI regions 68A and a second subset of the STI regions 68B having different heights from each other. The insulation material 62 is recessed such that upper portions of the semiconductor fins 54 and the dielectric fins 66 protrude above and from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material(s) of the insulation material 62. As will be subsequently described in greater detail, the etching process selectively etches the material(s) of the insulation material 62 at a faster rate than the materials of the semiconductor fins 54 and the dielectric fins 66. The semiconductor fins 54 and the dielectric fins 66 may thus be protected from damage during formation of the STI regions 68. Timed etch processes may be used to stop the etching of the insulation material 62 after the STI regions 68 reach desired heights. The STI regions 68 include the remaining portions of the insulation material 62 in the trenches 56.

In some embodiments, the insulation material 62 is recessed by a dry etch using hydrofluoric (HF) acid and ammonia ($NH_3$). Specifically, the insulation material 62 is etched by exposing the insulation material 62 to a gas source that includes HF acid and ammonia as the main process gases while generating a plasma. The gas source may also include a carrier gas such as nitrogen ($N_2$), argon (Ar), or the like. In some embodiments, the etching process is performed at a temperature in the range of 10° C. to 350° C., at a pressure in the range of 1 mTorr to 300 mTorr, and for a duration in the range of 15 seconds to 300 seconds. The etching process selectively etches the material of the unmodified insulating regions 62N at a faster rate than the material of the modified insulating regions 62M. For example, the etching process may be an oxide removal process, and the increased nitrogen in the modified insulating regions 62M may reduce the removal rate of the modified insulating regions 62M, relative the oxide removal process.

The unmodified insulating regions 62N of the insulation material 62 are recessed to form STI regions 68A between neighboring semiconductor fins 54, and the modified insulating regions 62M of the insulation material 62 are recessed to form STI regions 68B between respective pairs of neighboring semiconductor fins 54 and dielectric fins 66. The STI regions 68A are in the trenches 56A and between and among the semiconductor fins 54 of respective fin structures 52, and may be referred to as "inner STI regions." The STI regions 68B are in the trenches 56B and between adjacent fin structures 52 and around the dielectric fins 66 (e.g., between the semiconductor fins 54 and the dielectric fins 66), and may be referred to as "outer STI regions." As noted above, greater concentrations of an impurity (e.g. nitrogen) in the modified insulating regions 62M than concentrations of the impurity in the unmodified insulating regions 62N provide lower etching rates for the modified insulating regions 62M than etching rates for the unmodified insulating regions 62N, relative an etching process, because the impurity may react at a lower rate with the etchant chemical(s) of the etching process.

The greater etching selectivity of the unmodified insulating regions 62N causes the unmodified insulating regions 62N to be etched more than the modified insulating regions 62M during the recessing of the insulation material 62. This leads to the STI regions 68A having top surfaces located at greater depths below top surfaces of the semiconductor fins 54 than the top surfaces of the STI regions 68B. Thus, the top surfaces of the STI regions 68B are disposed further from the substrate 50 than the top surfaces of the STI regions 68A, and the STI regions 68B are disposed at smaller respective depths below the top surfaces of the semiconductor fins 54 than the respective depths at which the STI regions 68A are disposed below the top surfaces of the semiconductor fins 54. In other words, the STI regions 68B extend above the STI regions 68A, with respect to the substrate 50, and top surfaces of the STI regions 68A are disposed closer to the substrate 50 than top surfaces of the STI regions 68B with respect to the substrate 50. In some embodiments, the top surfaces of the STI regions 68B are disposed further from the substrate 50 than the top surfaces of the STI regions 68A by a distance $D_4$ in a range of 2 nm to 5 nm. The distance $D_4$ between the top surfaces of the STI regions 68A and the top surfaces of the STI regions 68B is also referred to as the "step height" of the STI regions 68. Recessing the STI regions 68 to have a step height in this range exposes the semiconductor fins 54 and the dielectric fins 66 without bending of the semiconductor fins 54, particularly when the height of the semiconductor fins 54 (previously described) is large, when the critical dimension of the semiconductor fins 54 (previously described) is small, or when the when the distance between the semiconductor fins 54 (previously described) is large. Recessing the STI regions 68 to have a step height outside of this range may cause bending of the semiconductor fins 54. Specifically, recessing the STI regions 68 to have a step height of less than 2 nm may cause outward bending of the semiconductor fins 54, and recessing the STI regions 68 to have a step height of greater than 5 nm may cause inward bending of the semiconductor fins 54. As will be subsequently described in greater detail, avoiding bending of the semiconductor fins 54 increases the processing window for subsequent operations.

The bending of the semiconductor fins 54 towards or away from each other may be quantified by a bending index computed from a first pitch $P_1$ measured between neighboring semiconductor fins 54 at a depth 5 nm below the top surfaces of the semiconductor fins 54 and a second pitch $P_2$ measured between the neighboring semiconductor fins 54 at a depth 60 nm below the top surfaces of the semiconductor fins 54. The bending index is the difference between the second pitch $P_2$ from the first pitch $P_1$. When the step height of the STI regions 68 is in the range of 2 nm to 5 nm, the bending index of the STI regions 68 may be between 0 nm and 2.5 nm, indicating an advantageously small amount of fin bending. When the step height is less than 2 nm, the bending index may be greater than 2.5 nm, indicating that the semiconductor fins 54 bend undesirably away from each other. When the step height is more than 5 nm, the bending index may be less than 0 nm, indicating that the semiconductor fins 54 bend undesirably towards each other.

In some embodiments, a desired ratio of the etch rate of the unmodified insulating regions 62N to the etch rate of the modified insulating regions 62M (e.g., the etch ratio of the unmodified insulating regions 62N and the modified insulating regions 62M), relative the etching process, is in a range of 40 to 70, which is advantageous for producing a step height in a range of 2 nm to 5 nm and reducing undesirable fin bending. Because the etching rate of the unmodified insulating regions 62N is faster than the etching rate of the modified insulating regions 62M, relative the etching process, the unmodified insulating regions 62N are etched more than the modified insulating regions 62M, resulting in a step height between the STI regions 68A and the STI regions 68B being in the range of 2 nm to 5 nm. The ratio of the etch rate of the unmodified insulating regions 62N to the etch rate of the modified insulating regions 62M being less than 40 may lead to the step height being less than 2 nm, increasing undesirable bending of the semiconductor fins 54 away from each other. The ratio of the etch rate of the unmodified insulating regions 62N to the etch rate of the modified insulating regions 62M being greater than 70 may lead to the step height being greater than 5 nm, increasing undesirable bending of the semiconductor fins 54 towards each other.

The desired ratio of the etch rate of the unmodified insulating regions 62N to the etch rate of the modified insulating regions 62M may be achieved by having a concentration of the impurity (e.g. nitrogen) in the modified insulating region 62M being greater than a concentration of the impurity in the unmodified insulating region 62N by a difference in a range of 1 at % to 2 at %, which may lead to the step height being in the desired range of 2 nm to 5 nm, which may reduce undesirable bending of the semiconductor fins 54. A difference of the concentration of the impurity in the modified insulating region 62M from the concentration of the impurity in the unmodified insulating region 62N being less than 1 at % may lead to the step height being less than 2 nm, which may increase undesirable bending of the semiconductor fins 54 away from each other. A difference of the concentration of the impurity in the modified insulating region 62M from the concentration of the impurity in the unmodified insulating region 62N being greater than 2 at % may lead to the step height being greater than 5 nm, which may increase undesirable bending of the semiconductor fins 54 towards from each other.

In some embodiments, each STI region 68B extends along three sides (e.g., the sidewalls and the bottom surface) of a dielectric fin 66. Specifically, a first portion of an STI region 68B is between a dielectric fin 66 and a first fin structure 52, a second portion of the STI region 68B is between the dielectric fin 66 and a second fin structure 52, and a third portion of the STI region 68B is beneath the dielectric fin 66.

It may be advantageous to epitaxially grow a material in n-type region 50N different from the material in p-type region 50P. In various embodiments, upper portions of the semiconductor fins 54 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not separately illustrated) may be formed in the semiconductor fins 54 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the semiconductor fins 54, the dielectric fins 66, and the STI regions 68 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist is removed, such as by any acceptable ashing process.

Following or prior to the implanting of the p-type region 50P, a mask (not separately illustrated) such as a photoresist is formed over the semiconductor fins 54, the dielectric fins 66, and the STI regions 68 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 54, the grown materials may be in situ doped during growth, which may obviate the implantations, although in situ and implantation doping may be used together.

Figure 8:
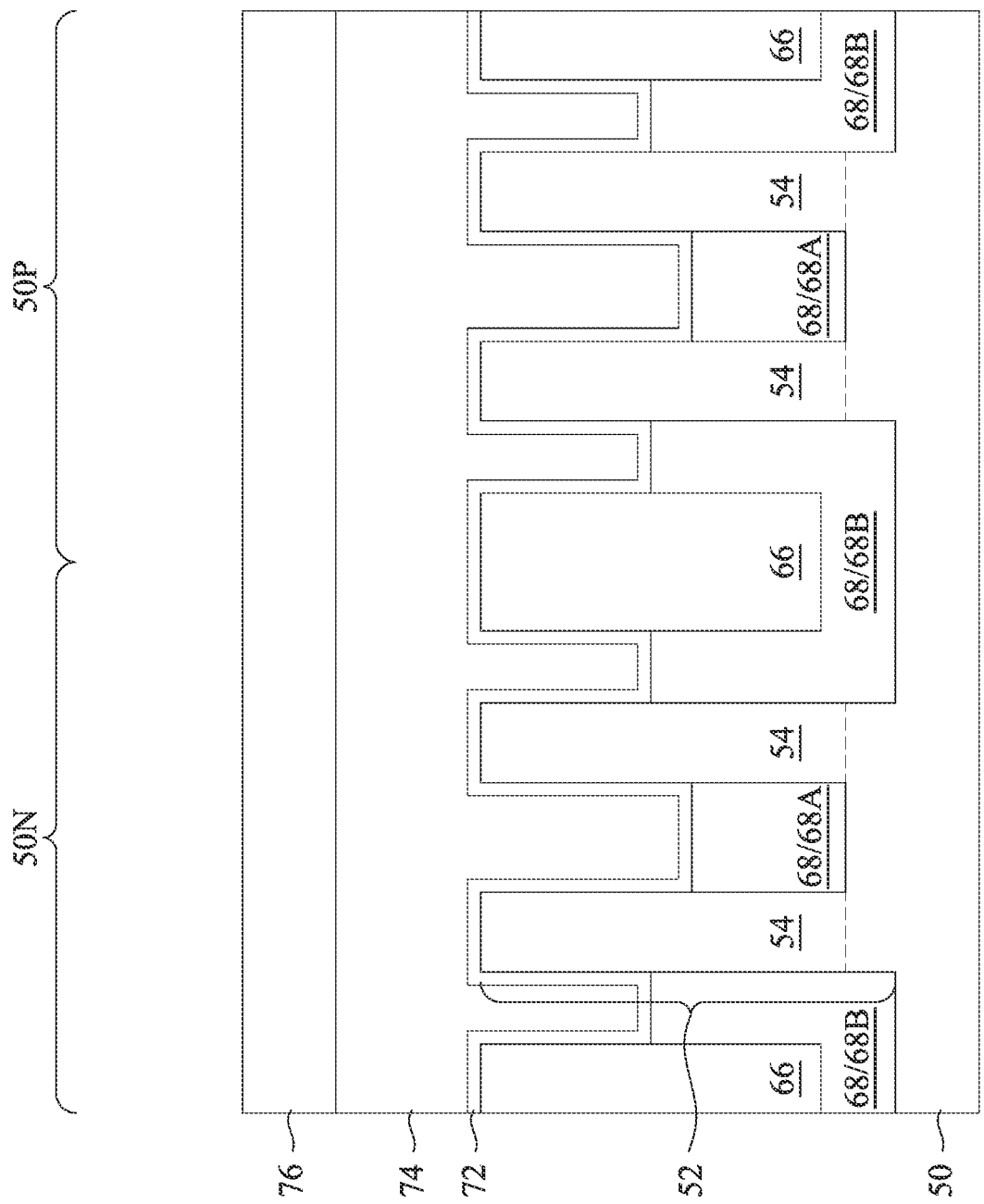

In FIG. 8, a dummy dielectric layer 72 is formed on the semiconductor fins 54 and the dielectric fins 66. The dummy dielectric layer 72 may be formed of a dielectric material such as silicon oxide, silicon nitride, a combination thereof, or the like, which may be deposited or thermally grown according to acceptable techniques such as ALD, in-situ steam growth (ISSG), rapid thermal oxidation (RTO), or the like. In some embodiments, the dummy dielectric layer 72 has a thickness in the range of 1 nm to 10 nm. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 68 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the semiconductor fins 54, the dielectric fins 66, and the STI regions 68, such that the dummy dielectric layer 72 extends over the STI regions 68 and between the dummy gate layer 74 and the STI regions 68. In another embodiment, the dummy dielectric layer 72 covers only the semiconductor fins 54.

As noted above, recessing the STI regions 68 to have a desired step height between the STI regions 68A and the STI regions 68B helps avoid bending of the semiconductor fins 54. Avoiding bending of the semiconductor fins 54 increases gap-filling properties during the deposition of the dummy gate layer 74, so that the formation of voids in the dummy gate layer 74 may be avoided. Manufacturing yield may thus be improved.

FIGS. 9A-17C illustrate various additional steps in the manufacturing of embodiment devices. FIGS. 9A-17C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figure 9B:
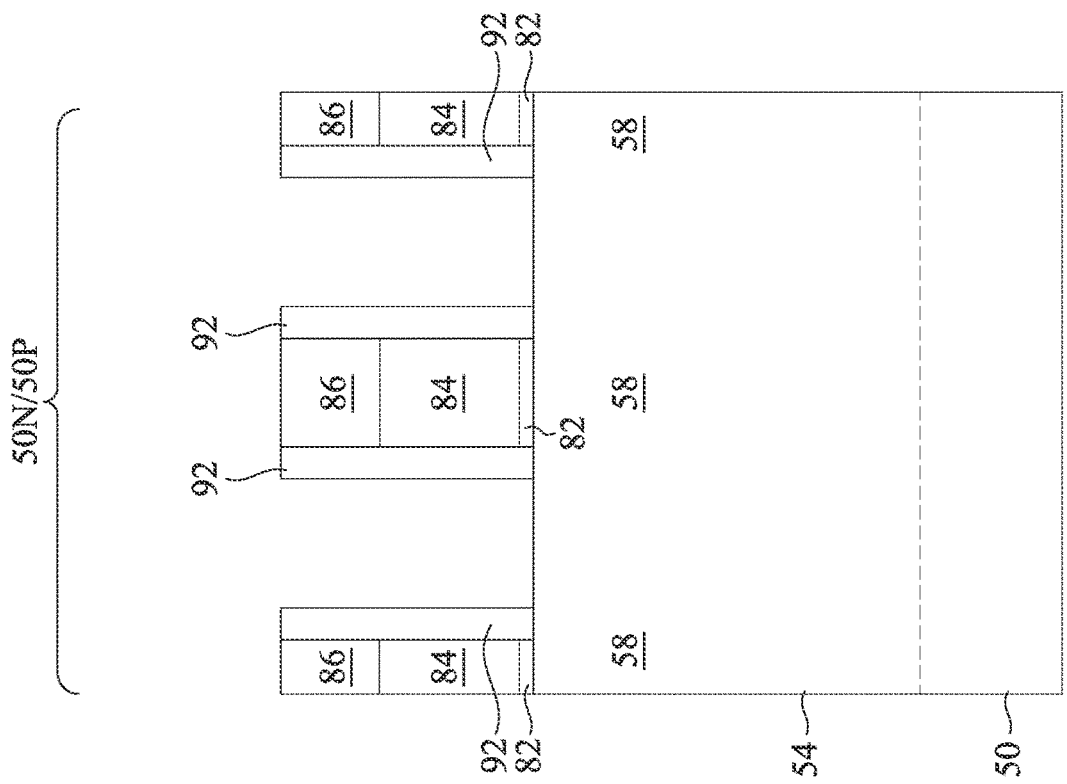
Figure 9A:
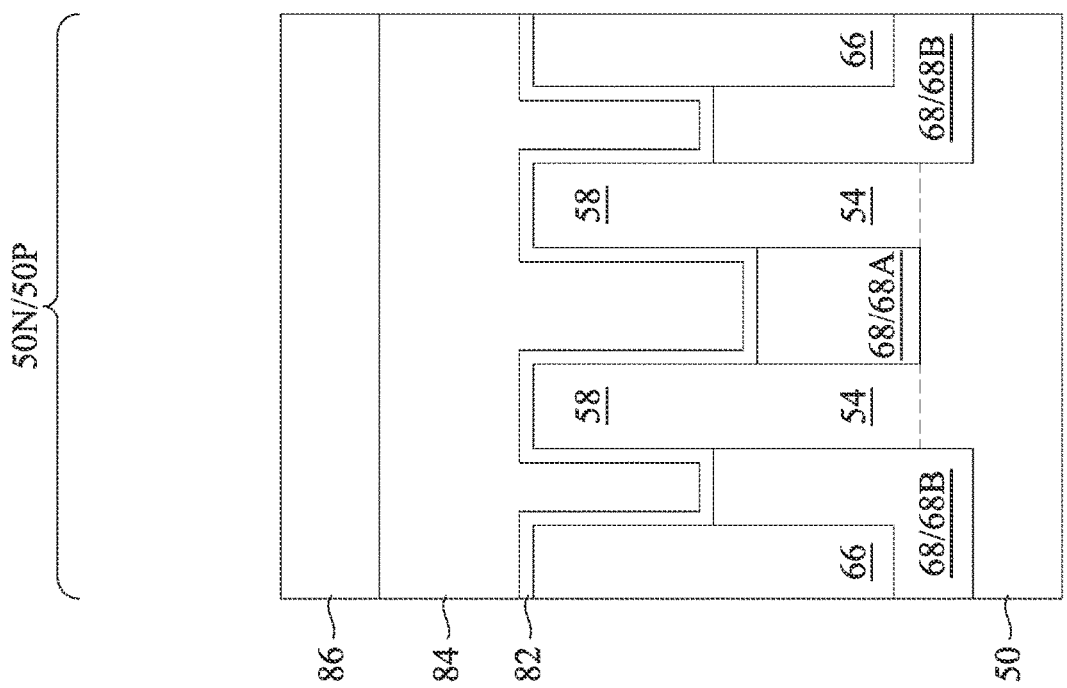
Figure 9C:
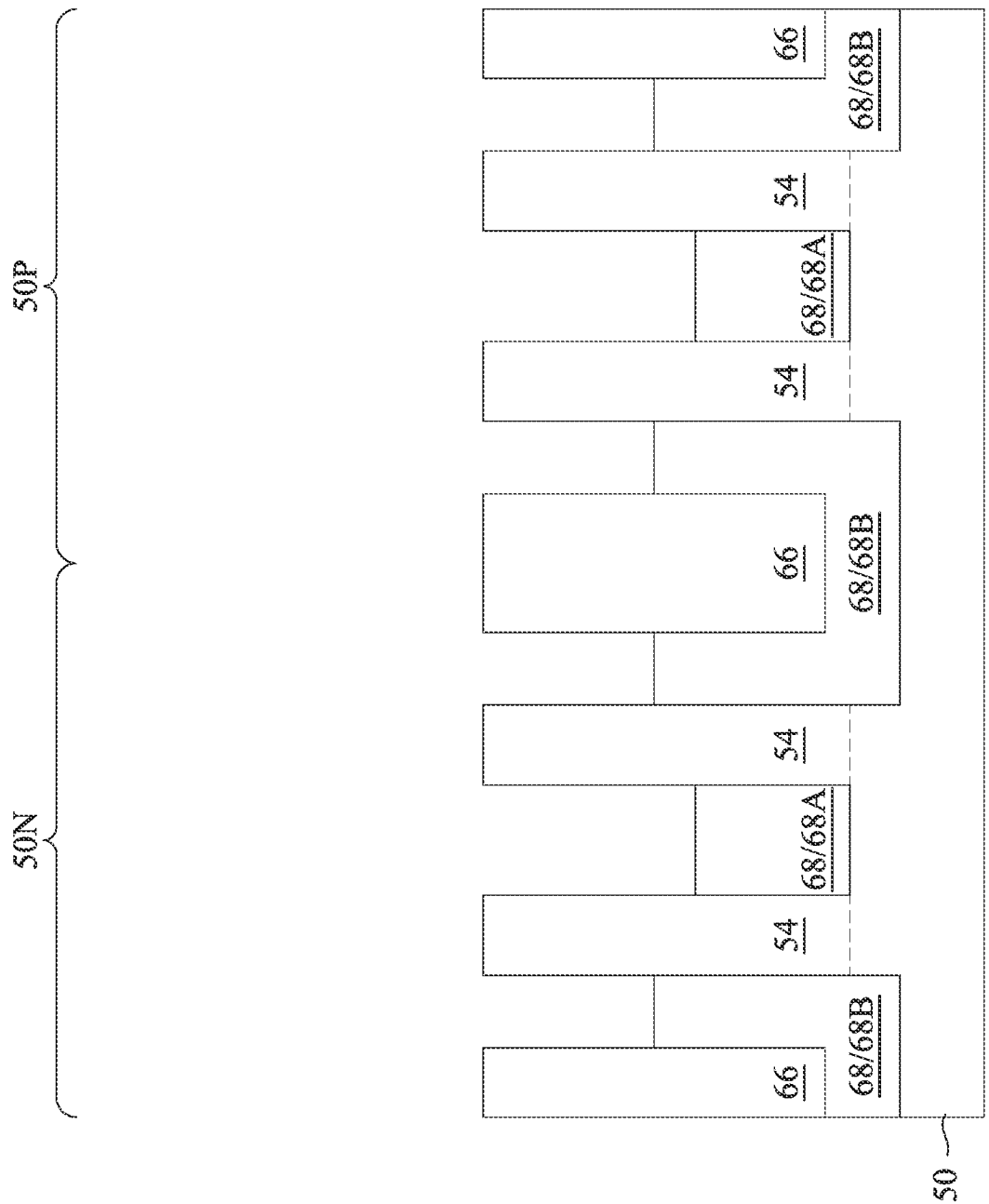

In FIG. 9A-9C, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover respective channel regions 58 of the semiconductor fins 54. The pattern of the masks 86 may be used to physically separate adjacent dummy gates 84. The dummy gates 84 may have lengthwise directions substantially perpendicular (within process variations) to the lengthwise directions of the semiconductor fins 54. The masks 86 may be removed during the patterning of the dummy gate 84, or may be removed during subsequent processing.

Gate spacers 92 are formed over the semiconductor fins 54, on exposed sidewalls of the masks 86 (if present), the dummy gates 84, and the dummy dielectrics 82. The gate spacers 92 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 92). In some embodiments the etch used to form the gate spacers 92 is adjusted so that the dielectric material(s), when etched, also have portions left on the sidewalls of the semiconductor fins 54 (thus forming fin spacers). After etching, the gate spacers 92 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 54 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 54 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 84, so that the channel regions 58 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 10B:
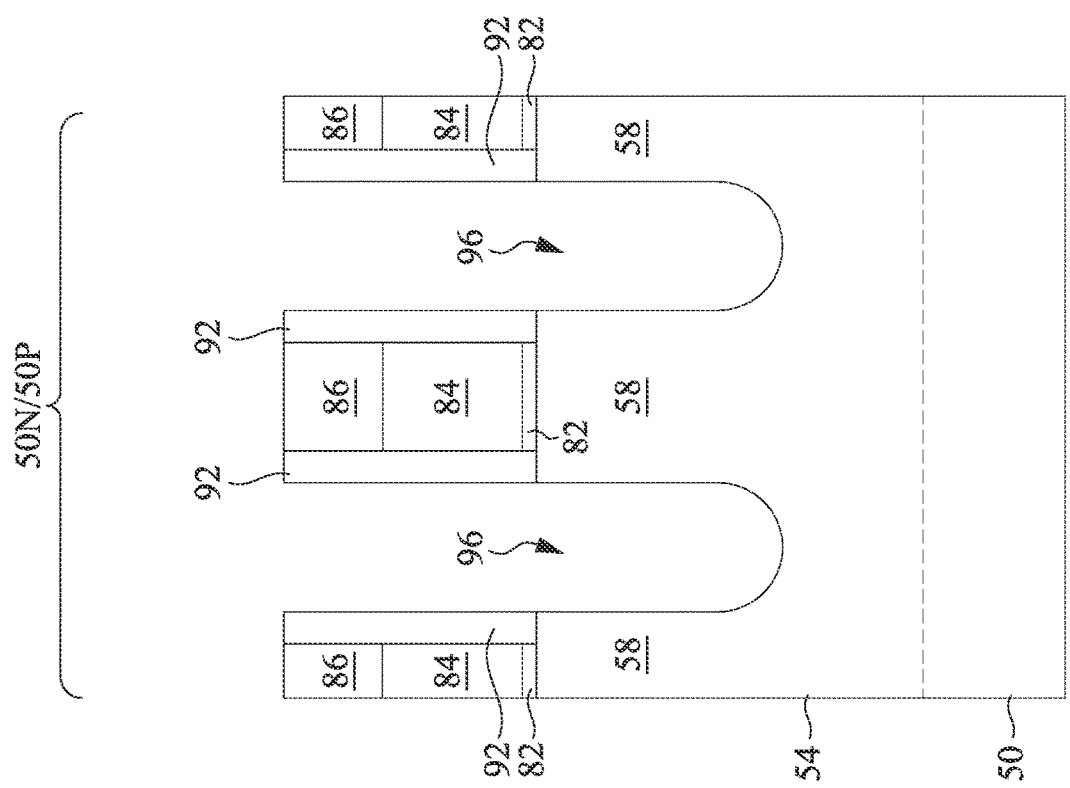
Figure 10A:
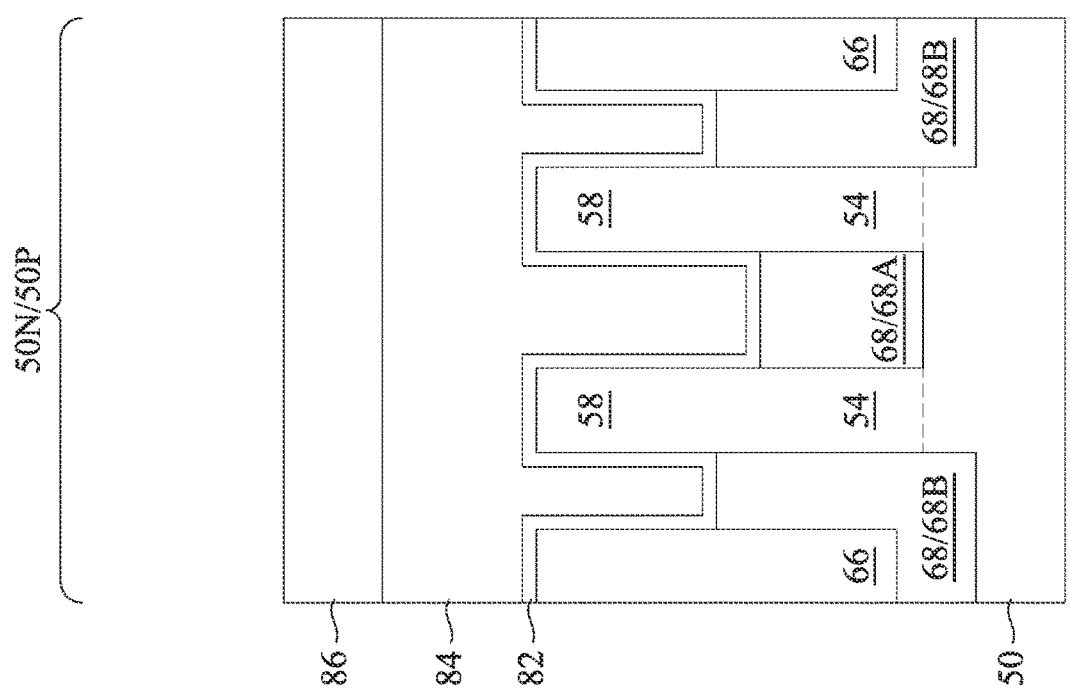

In FIGS. 10A-10C, source/drain recesses 96 are formed in the semiconductor fins 54. In the illustrated embodiment, the source/drain recesses 96 extend into the semiconductor fins 54. The source/drain recesses 96 may also extend into the substrate 50. In various embodiments, the source/drain recesses 96 may extend to a top surface of the substrate 50 without etching the substrate 50; the semiconductor fins 54 may be etched such that bottom surfaces of the source/drain recesses 96 are disposed below the top surfaces of the STI regions 68; or the like. The source/drain recesses 96 may be formed by etching the semiconductor fins 54 using an anisotropic etching processes, such as a RIE, a NBE, or the like. The etching process selectively etches the material(s) of the semiconductor fins 54 at a faster rate than the materials of the dielectric fins 66 and the STI regions 68. The gate spacers 92 and the dummy gates 84 collectively mask portions of the semiconductor fins 54 during the etching processes used to form the source/drain recesses 96. Timed etch processes may be used to stop the etching of the source/drain recesses 96 after the source/drain recesses 96 reach a desired depth. The dielectric fins 66 are not recessed, and remain between the fin structures 52 are the source/drain recesses 96 are etched.

As noted above, controlling the relative etch rates of the STI regions 68 to have a desired step height helps avoid bending of the semiconductor fins 54. Avoiding bending of the semiconductor fins 54 helps the source/drain recesses 96 have more uniform dimensions, so that subsequently grown source/drain regions may also have more uniform dimensions. Manufacturing yield may thus be improved.

Figure 11B:
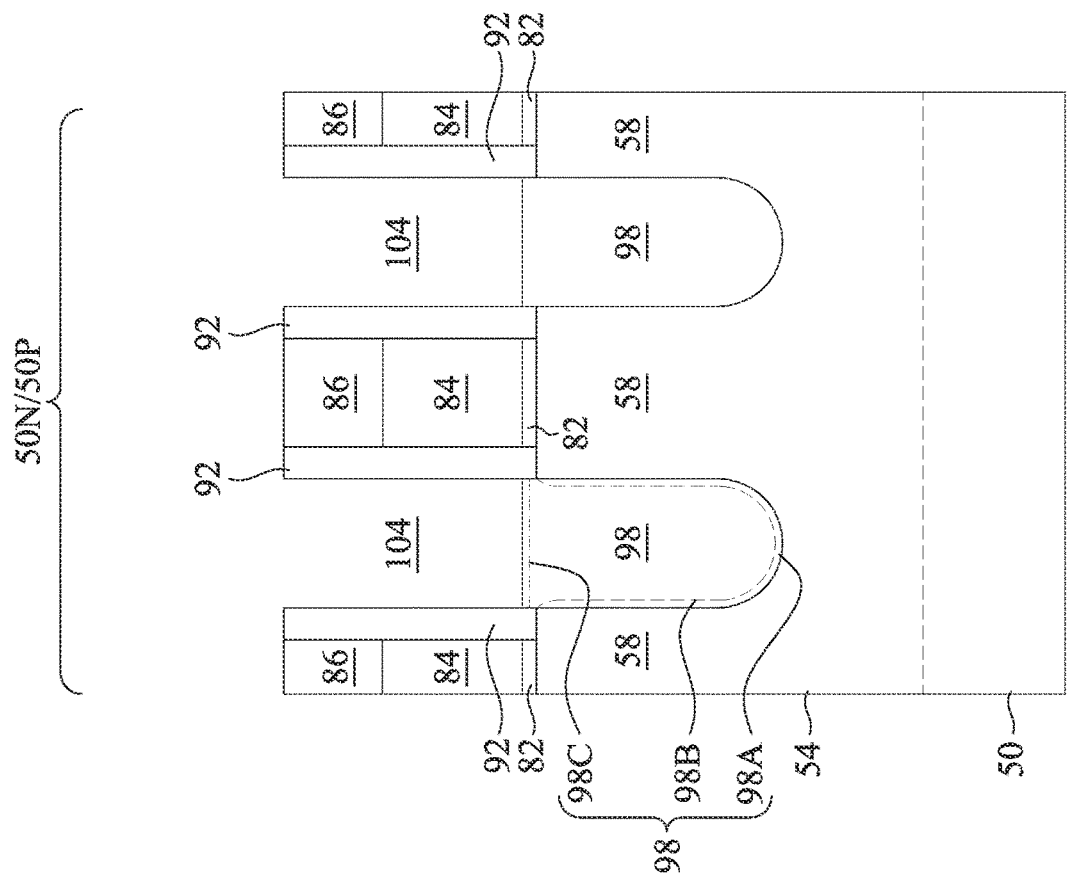
Figure 11A:
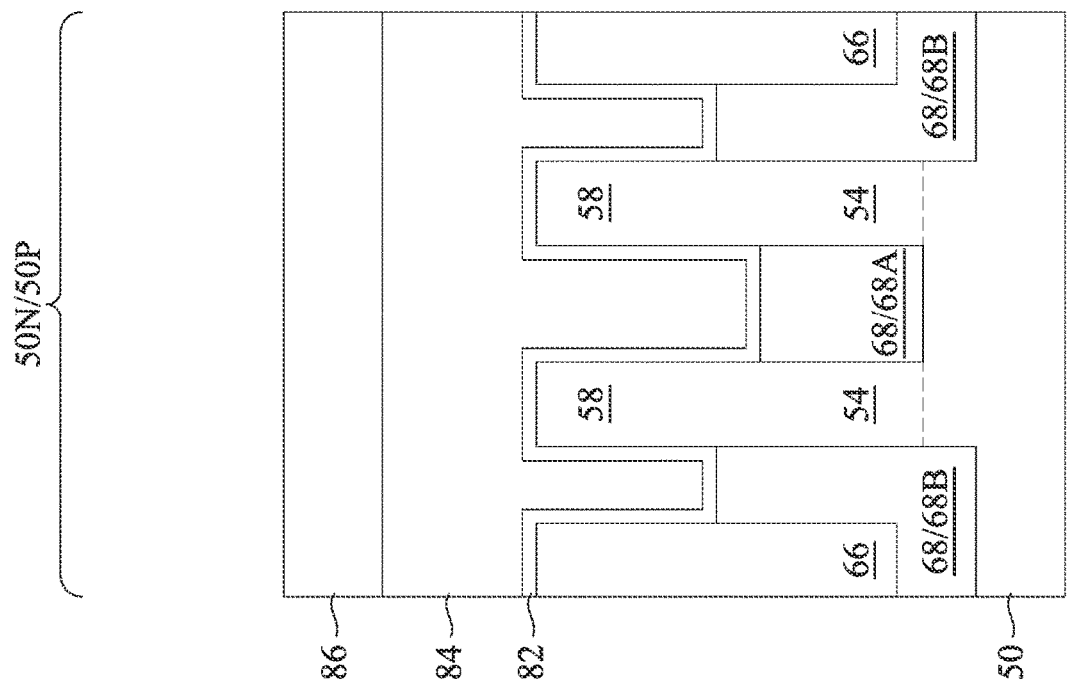
Figure 11C:
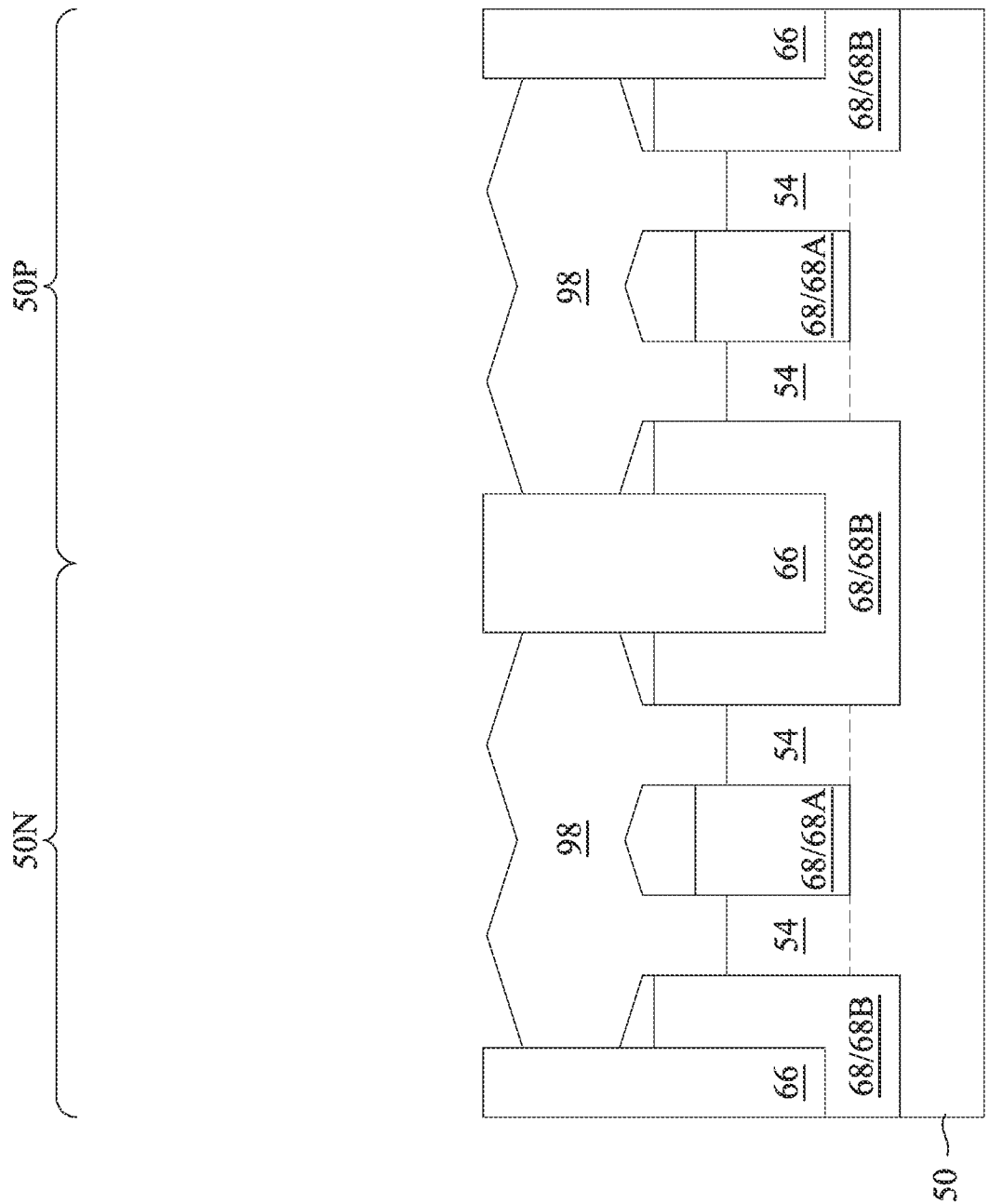

In FIGS. 11A-11C, epitaxial source/drain regions 98 are formed in the source/drain recesses 96. The epitaxial source/drain regions 98 are thus disposed in the semiconductor fins 54 such that each dummy gate 84 (and corresponding channel region 58) is between respective adjacent pairs of the epitaxial source/drain regions 98. The epitaxial source/drain regions 98 thus adjoin the channel regions 58. In some embodiments, the gate spacers 92 are used to separate the epitaxial source/drain regions 98 from the dummy gates 84 by an appropriate lateral distance so that the epitaxial source/drain regions 98 do not short out with subsequently formed gates of the resulting FinFETs. A material of the epitaxial source/drain regions 98 may be selected to exert stress in the respective channel regions 58, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 96 in the n-type region 50N. The epitaxial source/drain regions 98 may include any acceptable material appropriate for n-type devices. For example, if the semiconductor fins 54 are silicon, the epitaxial source/drain regions 98 in the n-type region 50N may include materials exerting a tensile strain on the channel regions 58, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the semiconductor fins 54 and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 96 in the p-type region 50P. The epitaxial source/drain regions 98 may include any acceptable material appropriate for p-type devices. For example, if the semiconductor fins 54 are silicon, the epitaxial source/drain regions 98 in the p-type region 50P may include materials exerting a compressive strain on the channel regions 58, such as silicon germanium, boron doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the semiconductor fins 54 and may have facets.

The epitaxial source/drain regions 98 and/or the semiconductor fins 54 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 98 may be in situ doped during growth.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. In embodiments in which the epitaxial source/drain regions 98 include three semiconductor material layers, the liner layers 98A may be grown in the source/drain recesses 96, the main layers 98B may be grown on the liner layers 98A, and the finishing layers 98C may be grown on the main layers 98B. The liner layers 98A, the main layers 98B, and the finishing layers 98C may be formed of different semiconductor materials and may be doped to different impurity concentrations. In some embodiments, the main layers 98B have a greater concentration of impurities than the finishing layers 98C, and the finishing layers 98C have a greater concentration of impurities than the liner layers 98A. Forming the liner layers 98A with a lesser concentration of impurities than the main layers 98B may increase adhesion in the source/drain recesses 96, and forming the finishing layers 98C with a lesser concentration of impurities than the main layers 98B may reduce out-diffusion of dopants from the main layers 98B during subsequent processing.

As a result of the epitaxy processes used to form the epitaxial source/drain regions 98, upper surfaces of the epitaxial source/drain regions have facets which expand laterally outward beyond sidewalls of the semiconductor fins 54. In some embodiments, these facets cause adjacent epitaxial source/drain regions 98 to merge as illustrated by FIG. 11C. However, the dielectric fins 66 (where present) block the lateral epitaxial growth to prevent coalescing of some of the epitaxial source/drain regions 98. For example, the dielectric fins 66 may be formed at cell boundaries to separate the epitaxial source/drain regions 98 of adjacent cells. Therefore, some of the epitaxial source/drain regions 98 are separated by the dielectric fins 66. The epitaxial source/drain regions 98 may contact the sidewalls of the dielectric fins 66. In some embodiments, fin spacers are formed to cover a portion of the sidewalls of the semiconductor fins 54 that extend above the STI regions 68, thereby blocking the epitaxial growth. In another embodiment, the spacer etch used to form the gate spacers 92 is adjusted to not form the fin spacers, so as to allow the epitaxial source/drain regions 98 to extend to the surfaces of the STI regions 68.

Figure 12B:
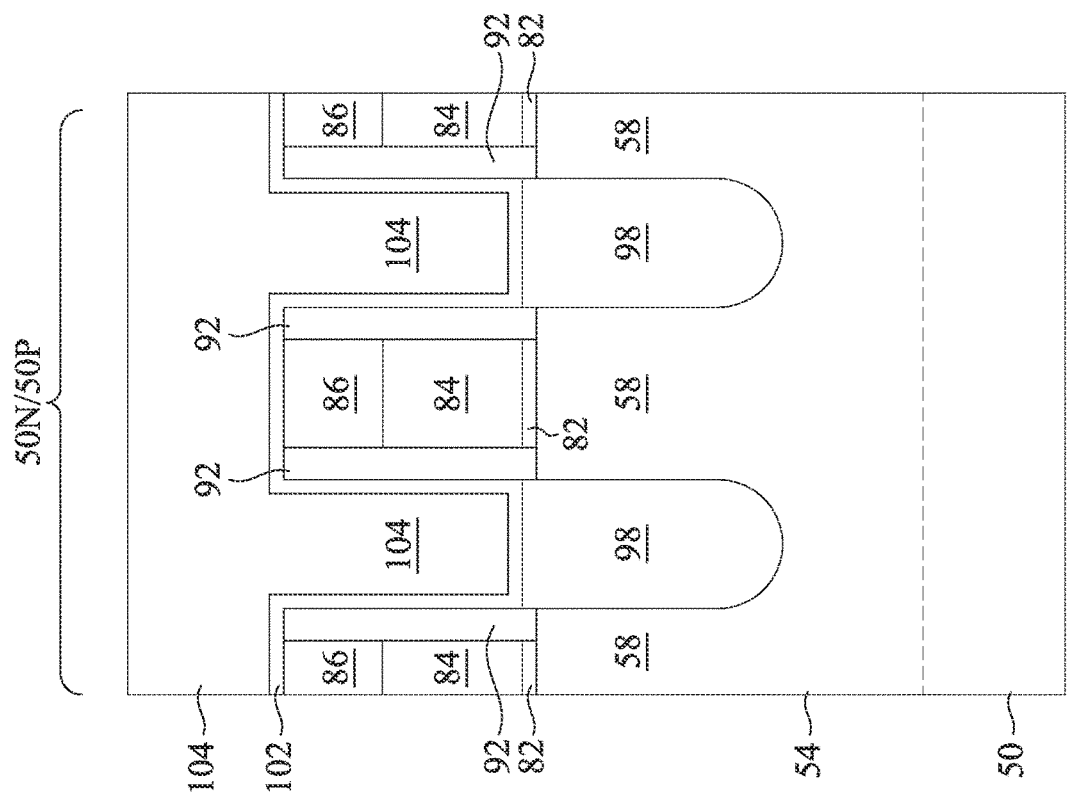
Figure 12A:
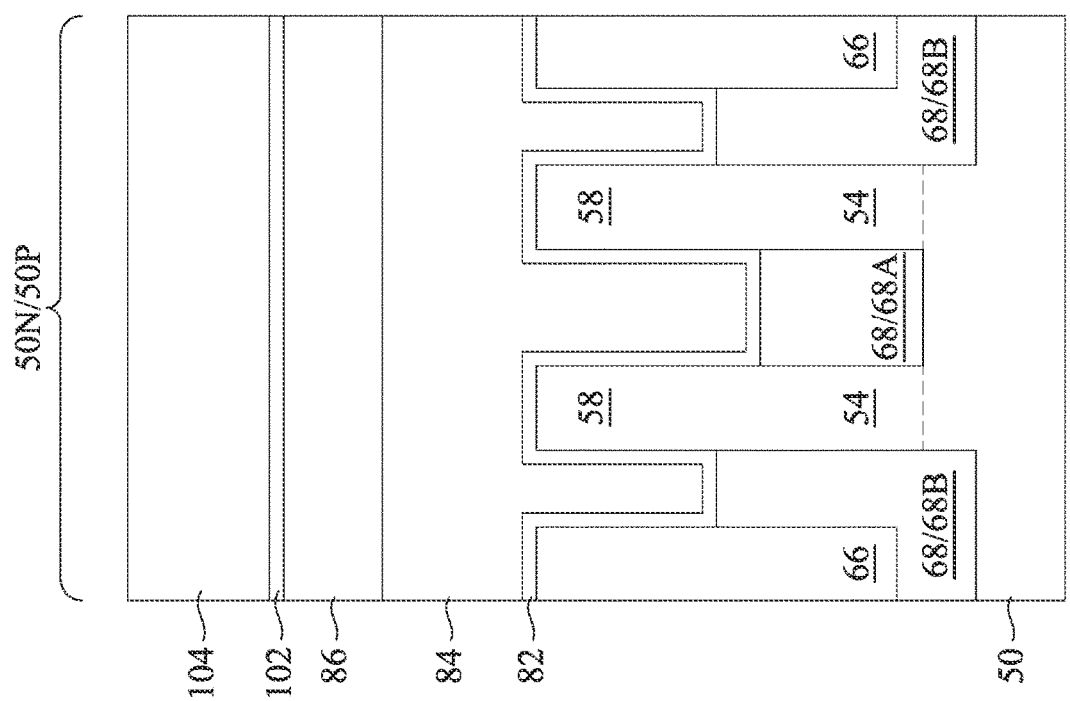
Figure 12C:
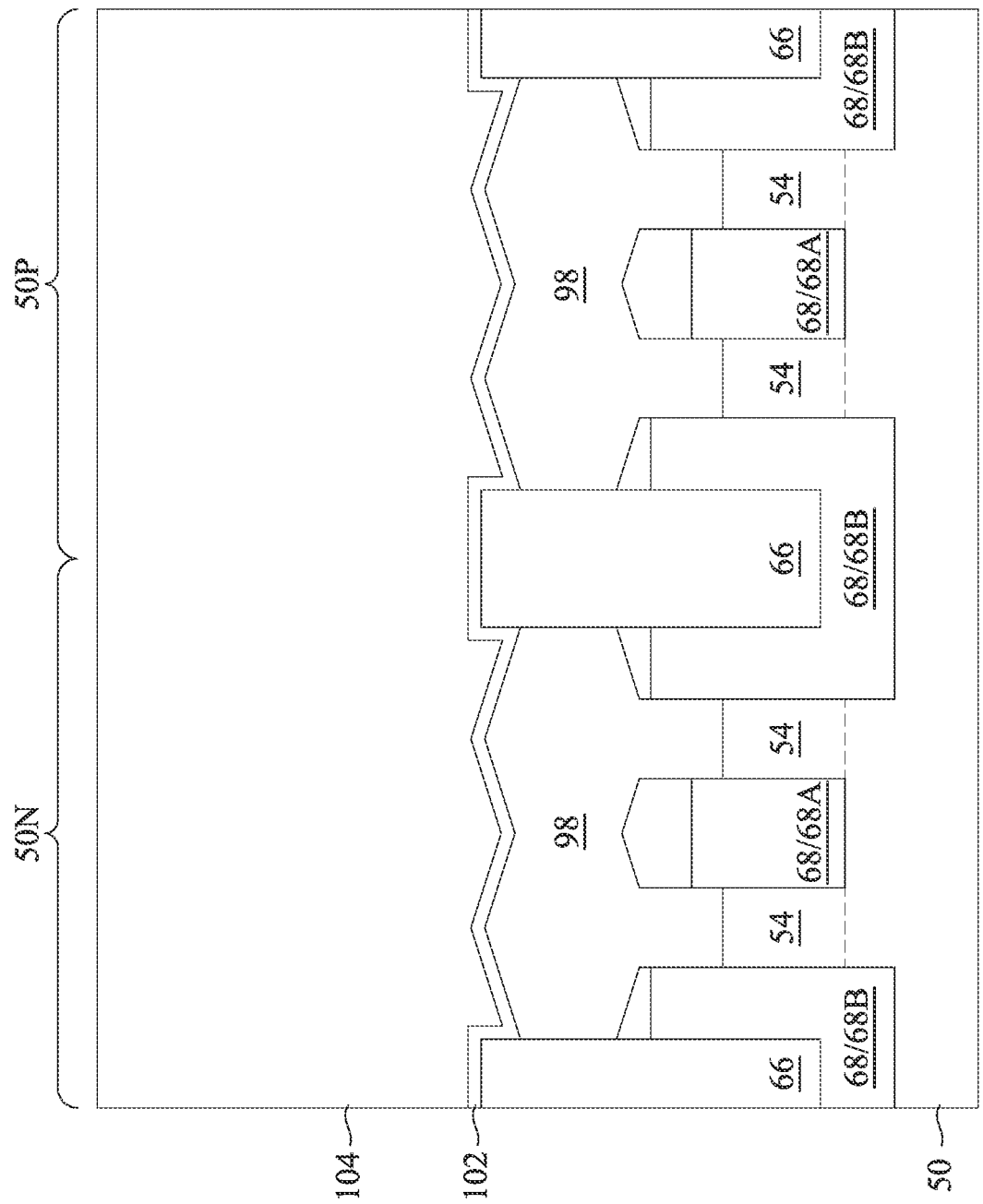

In FIGS. 12A-12C, a first inter-layer dielectric (ILD) 104 is deposited over the epitaxial source/drain regions 98, the gate spacers 92, the masks 86 (if present) or the dummy gates 84, and the dielectric fins 66. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), borosilicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 92, the masks 86 (if present) or the dummy gates 84, and the dielectric fins 66.

The CESL 102 may be formed of a dielectric material, such as silicon nitride, silicon oxide, silicon oxynitride, or the like, having a high etching selectivity from the etching of the first ILD 104. The CESL 102 may be formed by any suitable method, such as CVD, ALD, or the like.

Figure 13B:
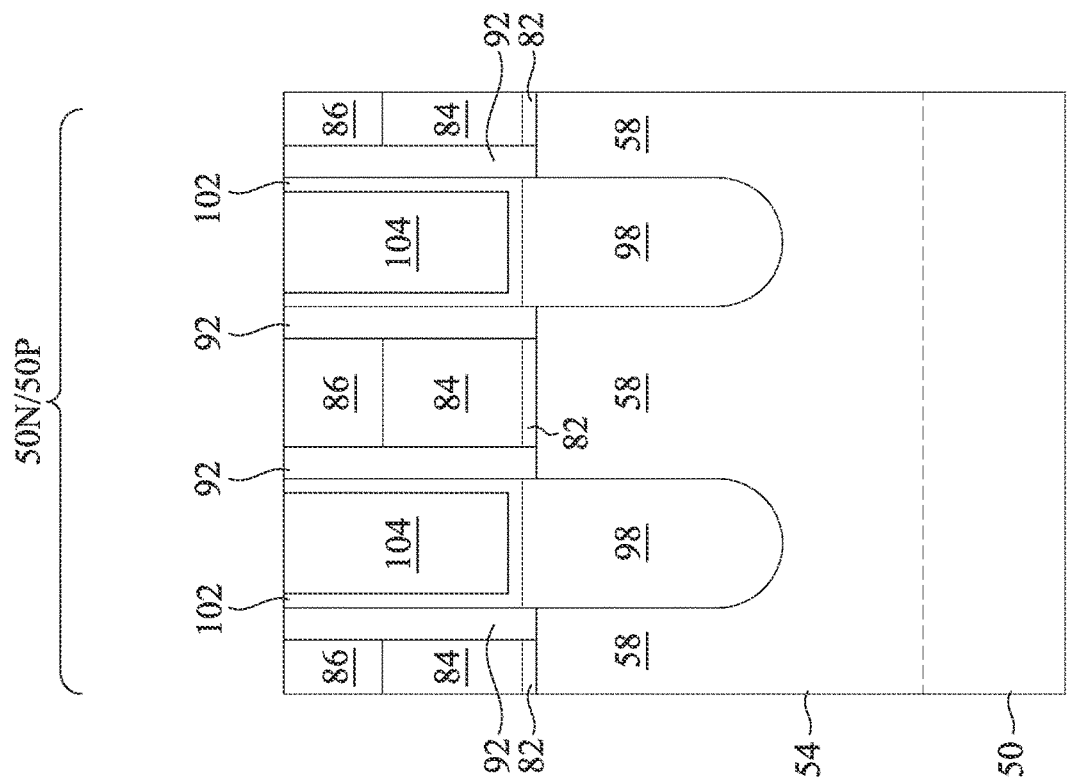
Figure 13A:
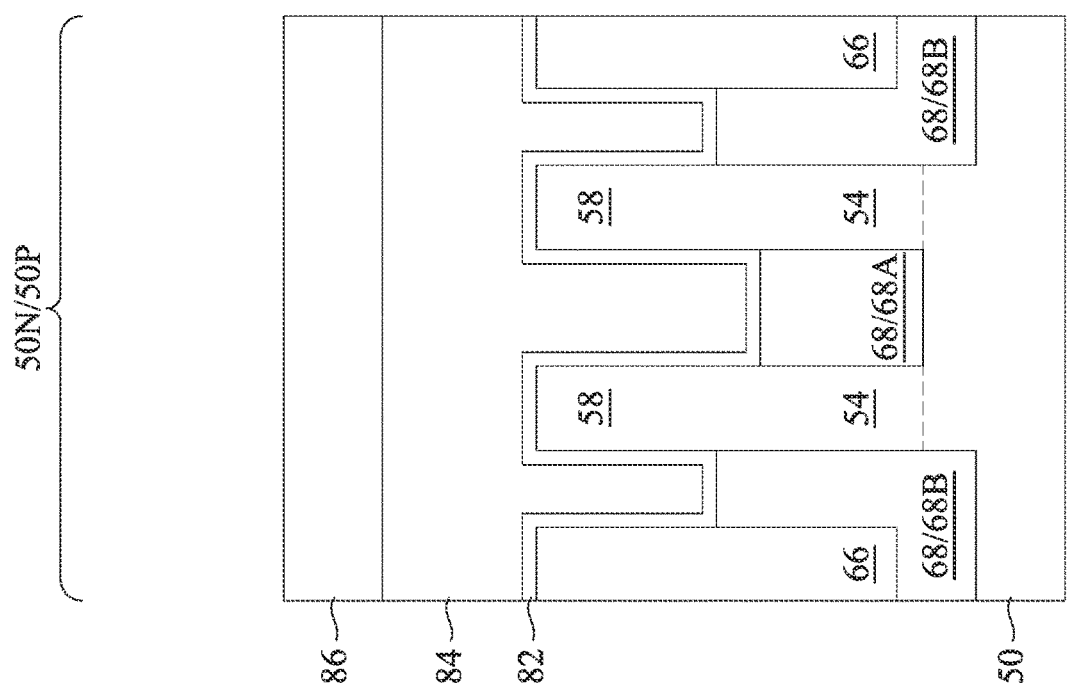
Figure 13C:
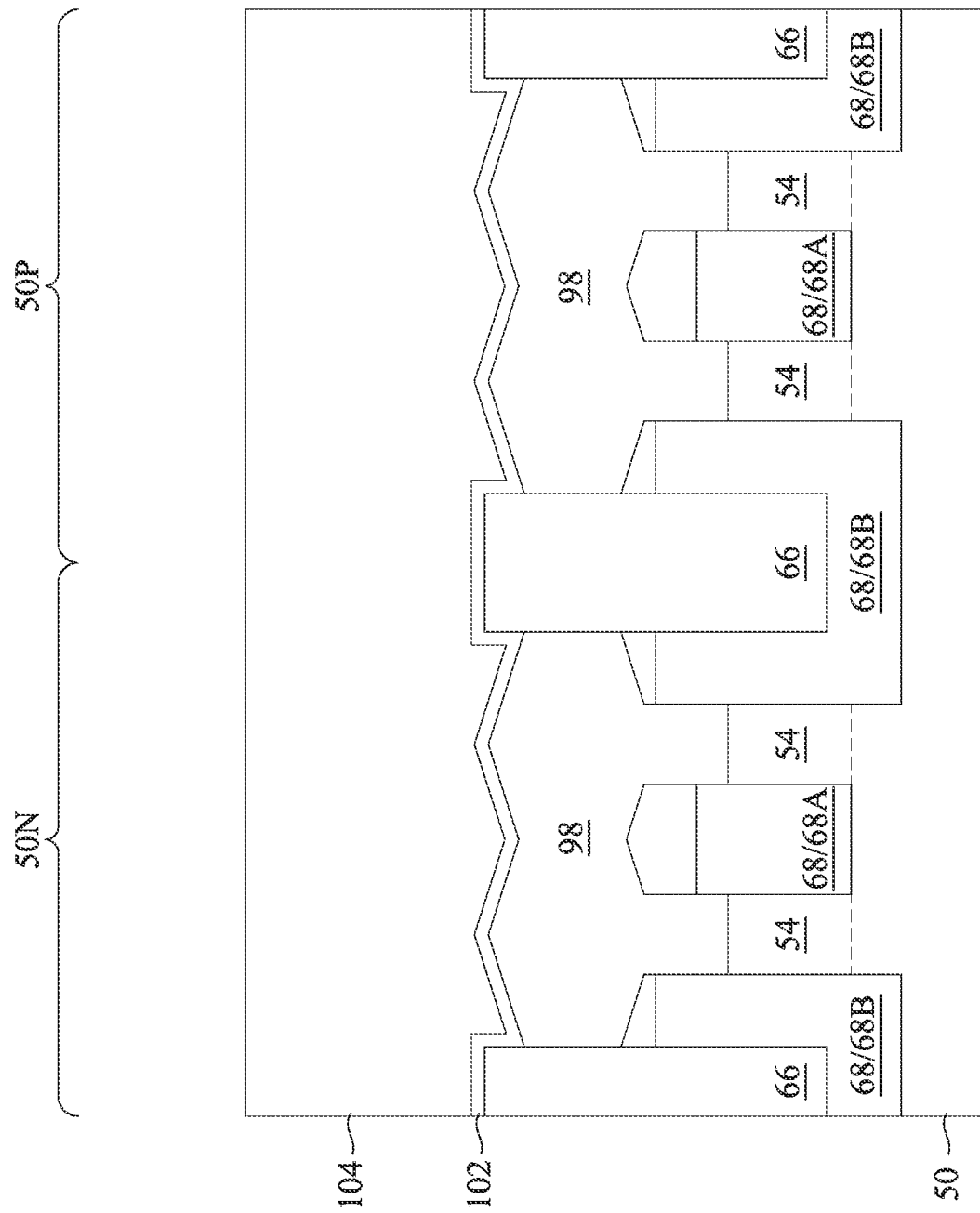

In FIGS. 13A-13C, a removal process is performed to level the top surfaces of the first ILD 104 with the top surfaces of the gate spacers 92 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 92 along sidewalls of the masks 86. After the planarization process, the top surfaces of the first ILD 104, the CESL 102, the gate spacers 92, and the masks 86 (if present) or the dummy gates 84 are coplanar (within process variations) such that they are level with each other. Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 14B:
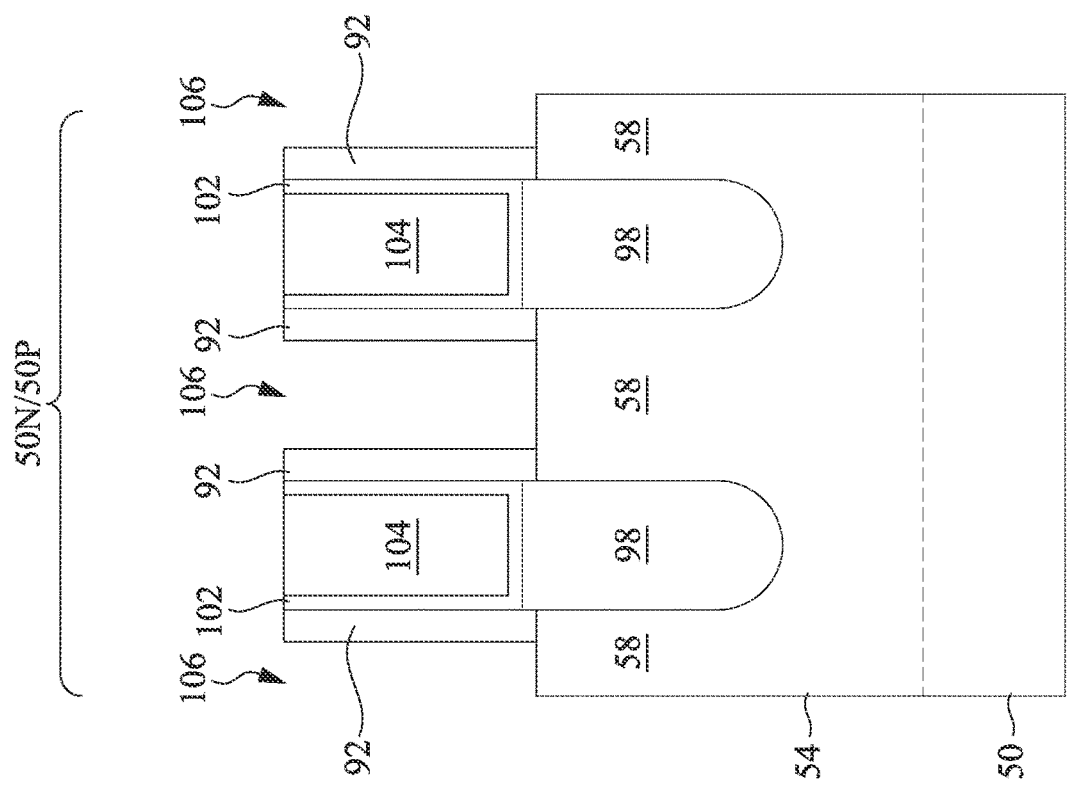
Figure 14A:
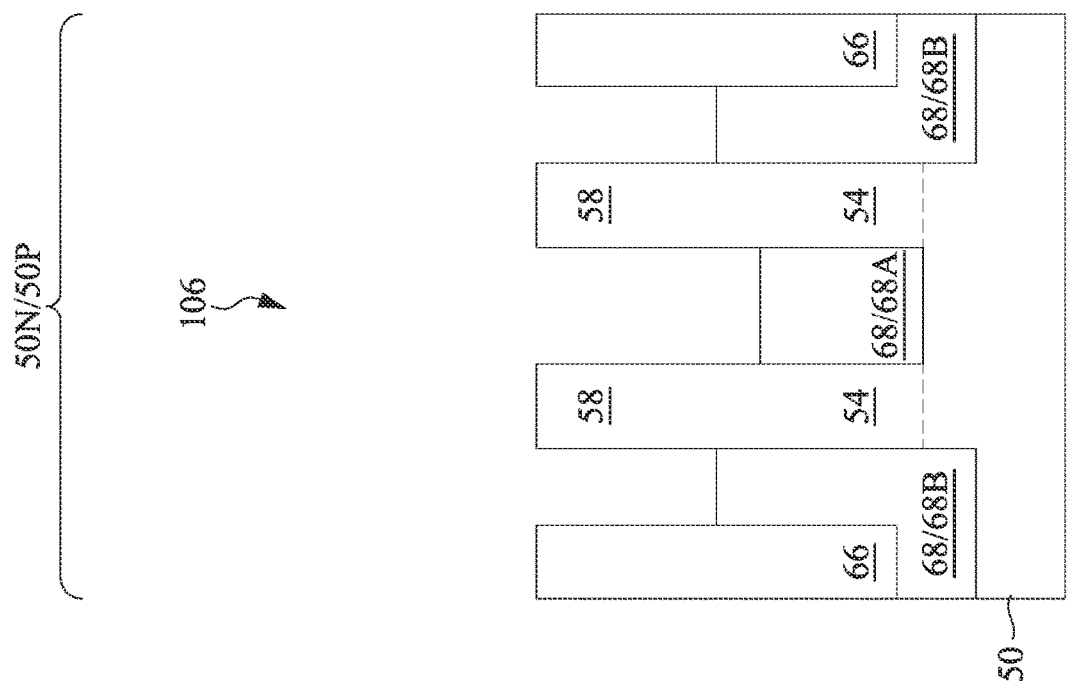
Figure 14C:
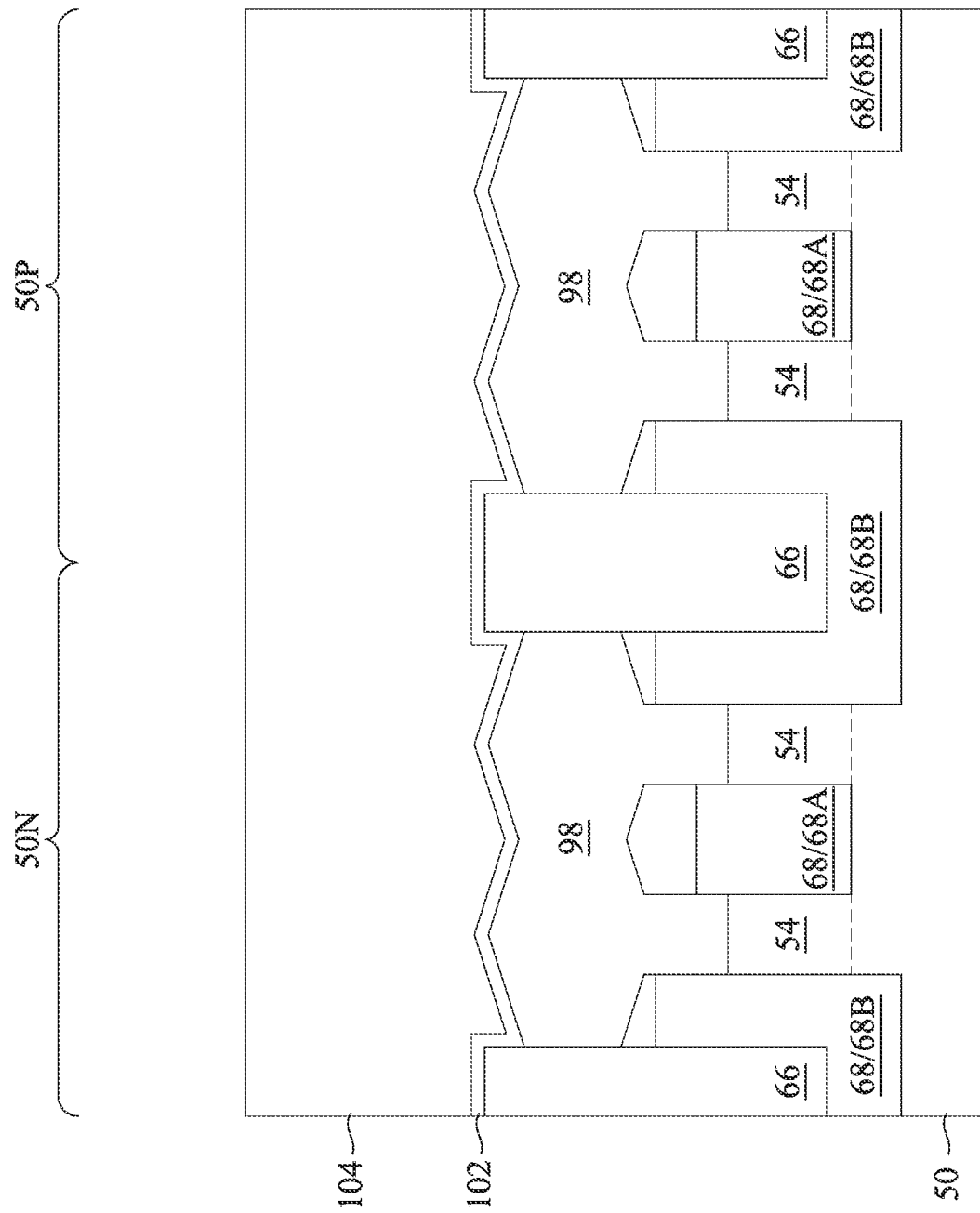

In FIGS. 14A-14C, the masks 86 (if present) and the dummy gates 84 are removed in an etching process, so that recesses 106 are formed. Portions of the dummy dielectrics 82 in the recesses 106 may also be removed. In some embodiments, only the dummy gates 84 are removed and the dummy dielectrics 82 remain and are exposed by the recesses 106. In some embodiments, the dummy dielectrics 82 are removed from recesses 106 in a first region of a die (e.g., a core logic region) and remain in recesses 106 in a second region of the die (e.g., an input/output region). In some embodiments, the dummy gates 84 are removed by an anisotropic dry etch process. For example, the etching process may include a dry etch process using reaction gas(es) that selectively etch the material of the dummy gates 84 at a faster rate than the materials of the first ILD 104 and the gate spacers 92. During the removal, the dummy dielectrics 82 may be used as etch stop layers when the dummy gates 84 are etched. The dummy dielectrics 82 may then be optionally removed after the removal of the dummy gates 84. Each recess 106 exposes and/or overlies a channel region 58 of a respective semiconductor fin 54. The recesses 106 may also expose the dielectric fins 66 (when the dummy dielectrics 82 are removed).

As noted above, recessing the STI regions 68 to have a desired step height between the STI regions 68A and the STI regions 68B helps avoid bending of the semiconductor fins 54. Avoiding bending of the semiconductor fins 54 increases the processing window for the removal of the dummy dielectrics 82 and/or the dummy gates 84, so that less residue of the dummy dielectrics 82 and/or the dummy gates 84 remains in the recesses 106. Manufacturing yield may thus be improved.

Figure 15B:
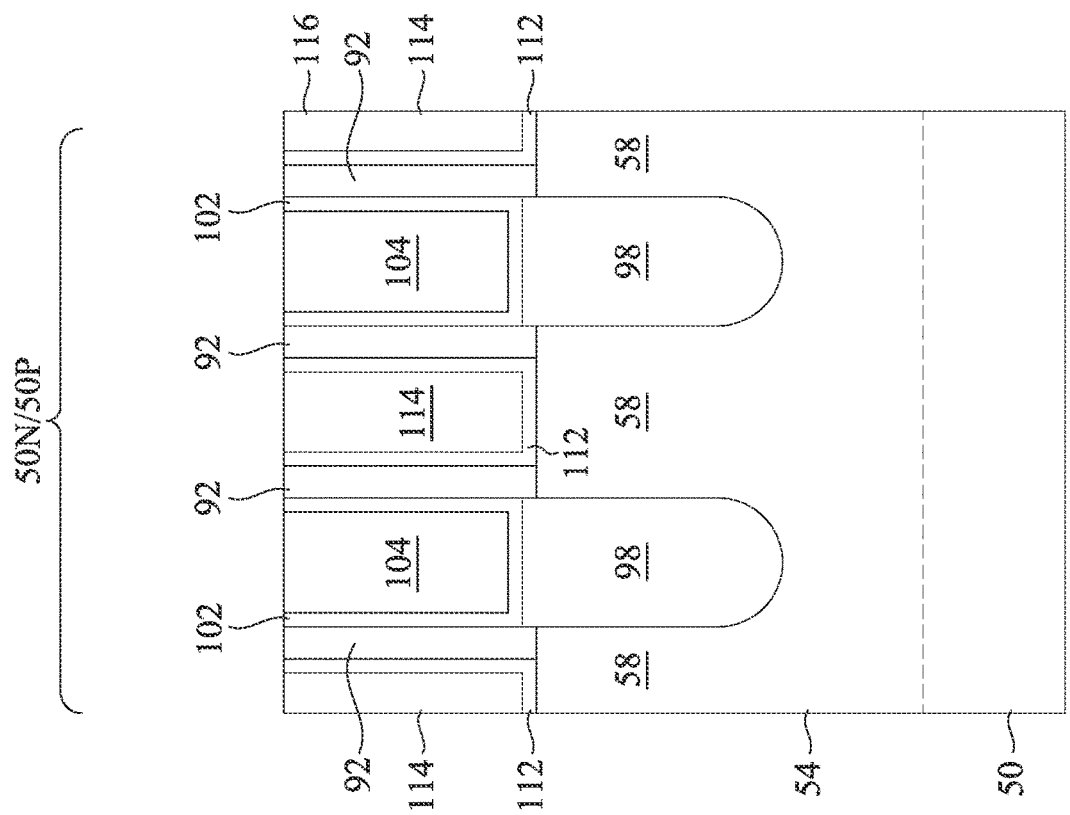
Figure 15A:
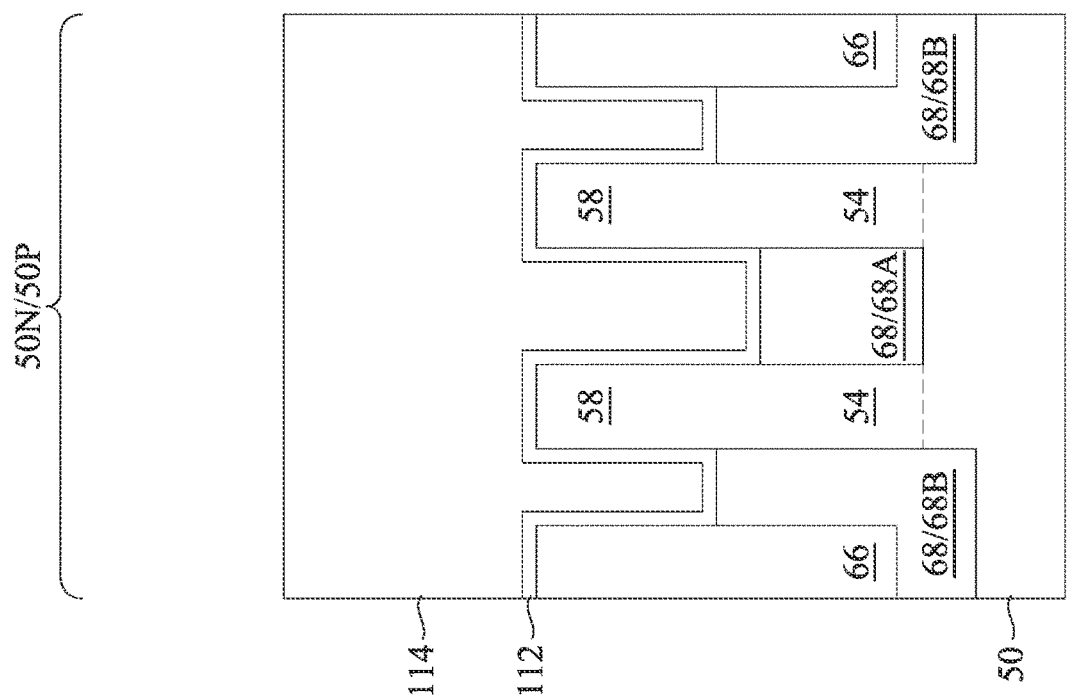
Figure 15C:
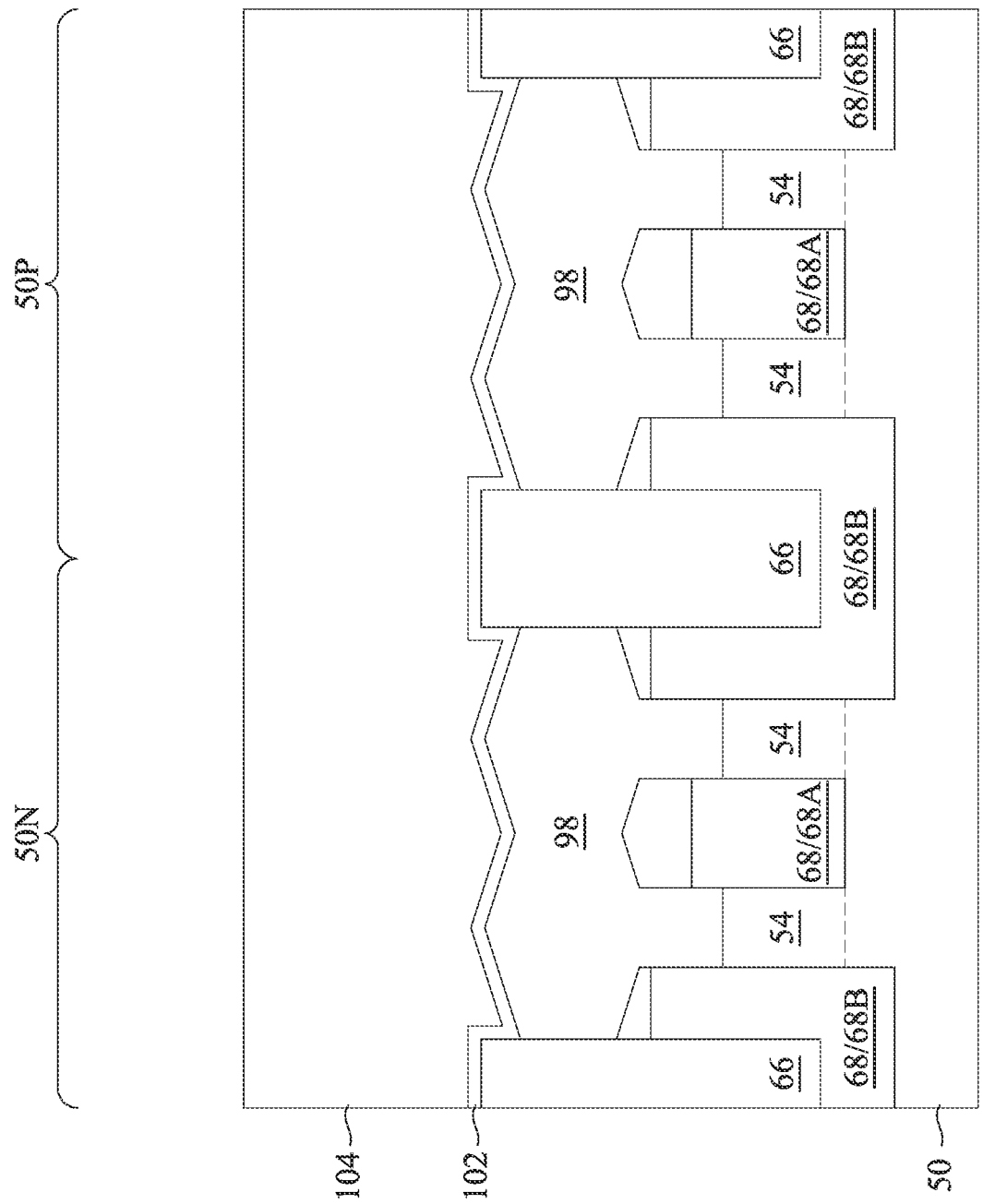

In FIGS. 15A-15C, gate dielectrics 112 and gate electrodes 114 are formed for replacement gates. Each respective pair of a gate dielectric 112 and a gate electrode 114 may be collectively referred to as a "gate structure." Each gate structure extends along sidewalls and a top surface of a channel region 58 of the semiconductor fins 54. Some of the gate structures further extend along sidewalls and a top surface of a dielectric fin 66.

The gate dielectrics 112 include one or more gate dielectric layer(s) disposed in the recesses 106, such as on the top surfaces and the sidewalls of the semiconductor fins 54, on the top surfaces and the sidewalls of the dielectric fins 66, and on sidewalls of the gate spacers 92. The gate dielectrics 112 may include an oxide such as silicon oxide or a metal oxide, a silicate such as a metal silicate, combinations thereof, multi-layers thereof, or the like. The gate dielectrics 112 may include a high-k dielectric material, such as a metal oxide or a silicate of hafnium, aluminum, zirconium, lanthanum, manganese, barium, titanium, lead, and combinations thereof. The dielectric material(s) of the gate dielectrics 112 may be formed by molecular-beam deposition (MBD), ALD, PECVD, or the like. In embodiments where portions of the dummy dielectrics 82 remain in the recesses 106, the gate dielectrics 112 includes a material of the dummy dielectrics 82 (e.g., silicon oxide). Although a single-layered gate dielectrics 112 are illustrated, the gate dielectrics 112 may include any number of interfacial layers and any number of main layers. For example, the gate dielectrics 112 may include an interfacial layer and an overlying high-k dielectric layer.

The gate electrodes 114 include one or more gate electrode layer(s) disposed over the gate dielectrics 112, which fill the remaining portions of the recesses 106. The gate electrodes 114 may include a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 114 are illustrated, the gate electrodes 114 may include any number of work function tuning layers, any number of barrier layers, any number of glue layers, and a fill material.

As an example to form the gate structures, one or more gate dielectric layer(s) may be deposited in the recesses 106. The gate dielectric layer(s) may also be deposited on the top surfaces of the first ILD 104, the CESL 102, and the gate spacers 92. Subsequently, one or more gate electrode layer(s) may be deposited on the gate dielectric layer(s). A removal process may then be performed to remove the excess portions of the gate dielectric layer(s) and the gate electrode layer(s), which excess portions are over the top surfaces of the first ILD 104, the CESL 102, and the gate spacers 92. The gate dielectric layer(s), after the removal process, have portions left in the recesses 106 (thus forming the gate dielectrics 112). The gate electrode layer(s), after the removal process, have portions left in the recesses 106 (thus forming the gate electrodes 114). In some embodiments, a planarization process such as a chemical mechanical polish (CMP), an etch-back process, combinations thereof, or the like may be utilized. After the planarization process, the top surfaces of the gate spacers 92, the CESL 102, the first ILD 104, the gate dielectrics 112, and the gate electrodes 114 are coplanar (within process variations) such that they are level with each other.

The formation of the gate dielectrics 112 in the n-type region 50N and the p-type region 50P may occur simultaneously such that the gate dielectrics 112 in each region are formed of the same material(s), and the formation of the gate electrodes 114 may occur simultaneously such that the gate electrodes 114 in each region are formed of the same material(s). In some embodiments, the gate dielectrics 112 in each region may be formed by distinct processes, such that the gate dielectrics 112 may include different materials and/or have a different number of layers, and/or the gate electrodes 114 in each region may be formed by distinct processes, such that the gate electrodes 114 may include different materials and/or have a different number of layers. Various masking steps may be used to mask and expose appropriate regions when using distinct processes.

Figure 16B:
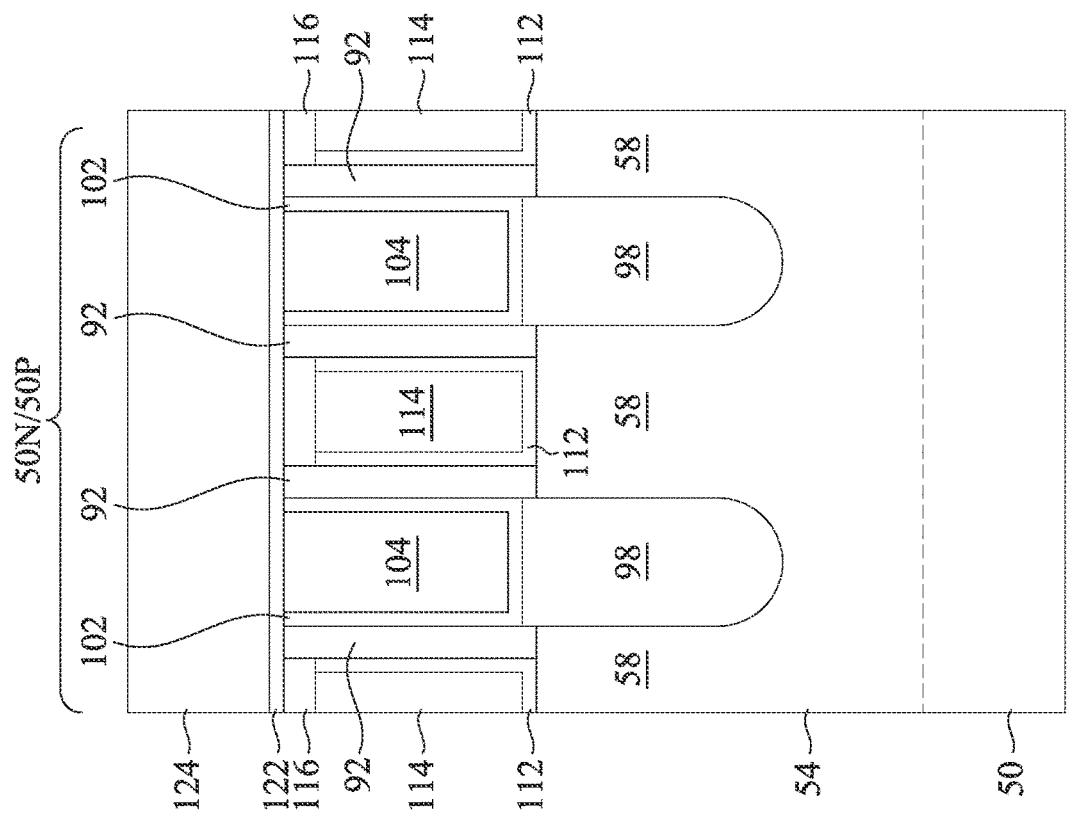
Figure 16A:
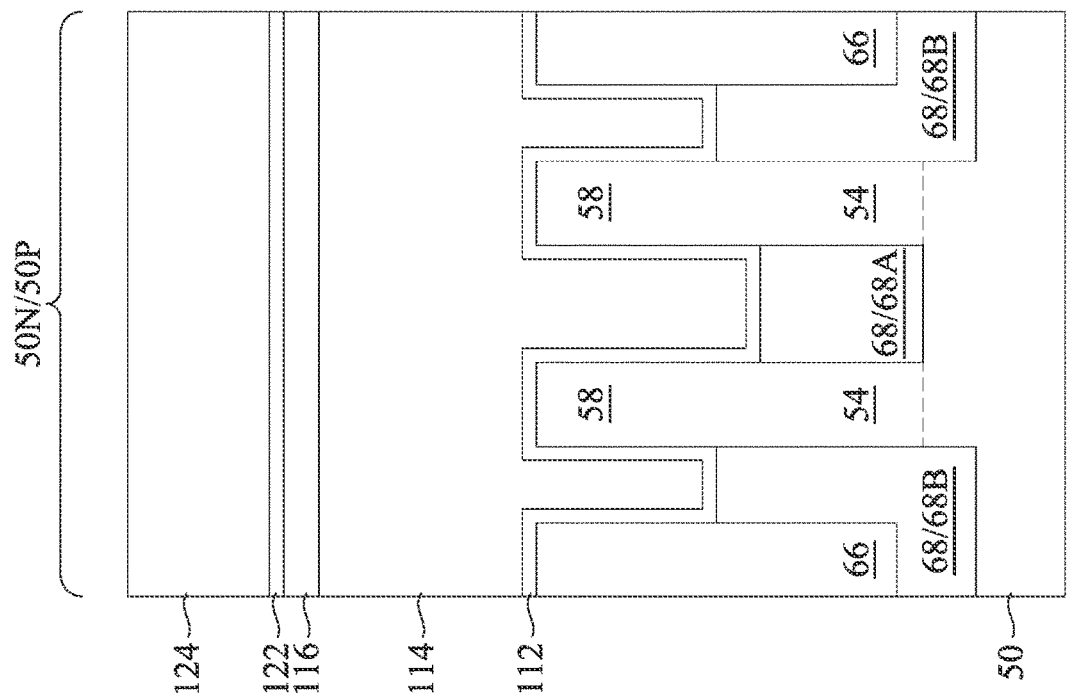
Figure 16C:
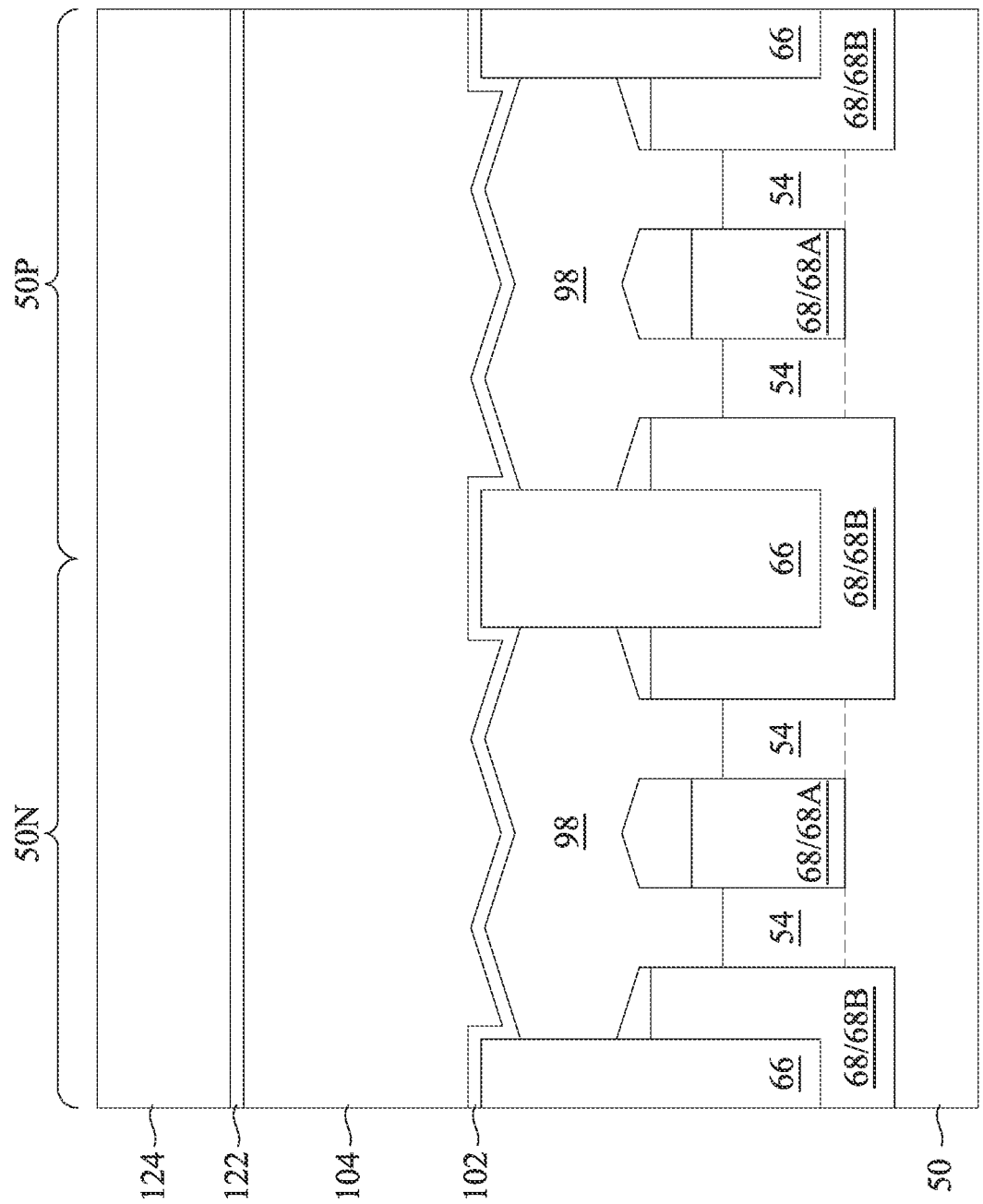

In FIGS. 16A-16C, a second ILD 124 is deposited over the gate spacers 92, the CESL 102, the first ILD 104, the gate dielectrics 112, and the gate electrodes 114. In some embodiments, the second ILD 124 is a flowable film formed by a flowable CVD method. In some embodiments, the second ILD 124 is formed of a dielectric material such as PSG, BSG, BPSG, USG, or the like, which may be deposited by any suitable method, such as CVD, PECVD, or the like.

Optionally, before the formation of the second ILD 124, gate masks 116 are formed over the gate structures (including the gate dielectrics 112 and the gate electrodes 114). As an example to form the gate masks 116, the gate structures and optionally the gate spacers 92 may be recessed using any acceptable etching process. One or more dielectric material(s) may then be formed in the recesses and on the top surfaces of the CESL 102 and the first ILD 104. Acceptable dielectric materials include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. A removal process is performed to remove the excess portions of the dielectric material(s), which excess portions are over the top surfaces of the CESL 102 and the first ILD 104, thereby forming the gate masks 116. The dielectric material(s), after the removal process, have portions left in the recesses (thus forming the gate masks 116). In some embodiments, a planarization process such as a chemical mechanical polish (CMP), an etch-back process, combinations thereof, or the like may be utilized. After the planarization process, the top surfaces of the CESL 102, the first ILD 104, and the gate masks 116 are coplanar (within process variations) such that they are level with each other. Gate contacts will be subsequently formed to penetrate through the gate masks 116 to contact the top surfaces of the gate electrodes 114.

In some embodiments, an etch stop layer (ESL) 122 is formed between the second ILD 124 and the gate spacers 92, the CESL 102, the first ILD 104, and the gate masks 116 (if present) or the gate dielectrics 112 and the gate electrodes 114. The ESL 122 may include a dielectric material, such as, silicon nitride, silicon oxide, silicon oxynitride, or the like, having a high etching selectivity from the etching of the second ILD 124.

Figure 17B:
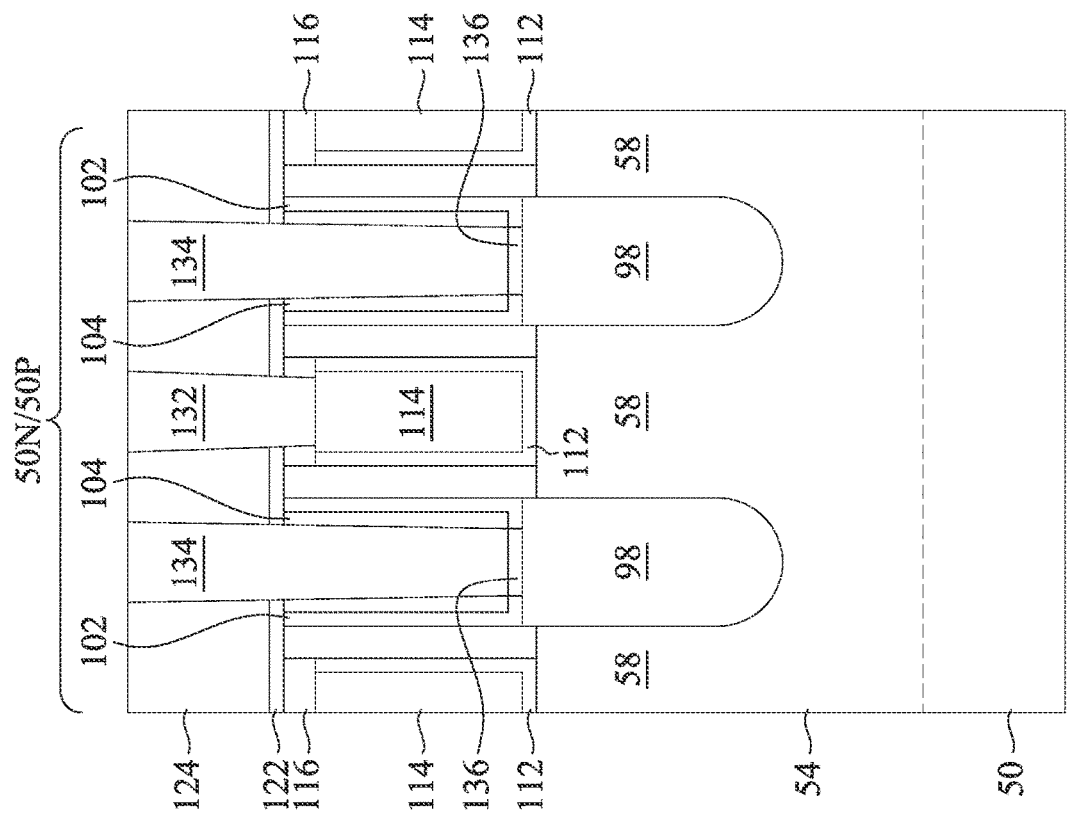
Figure 17A:
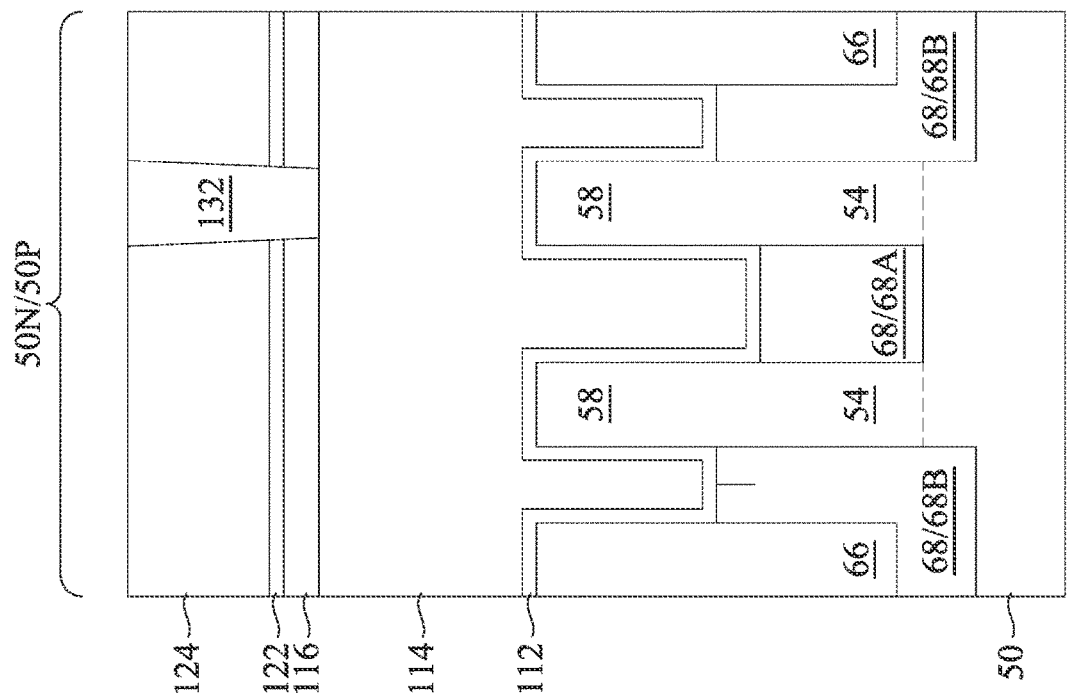
Figure 17C:
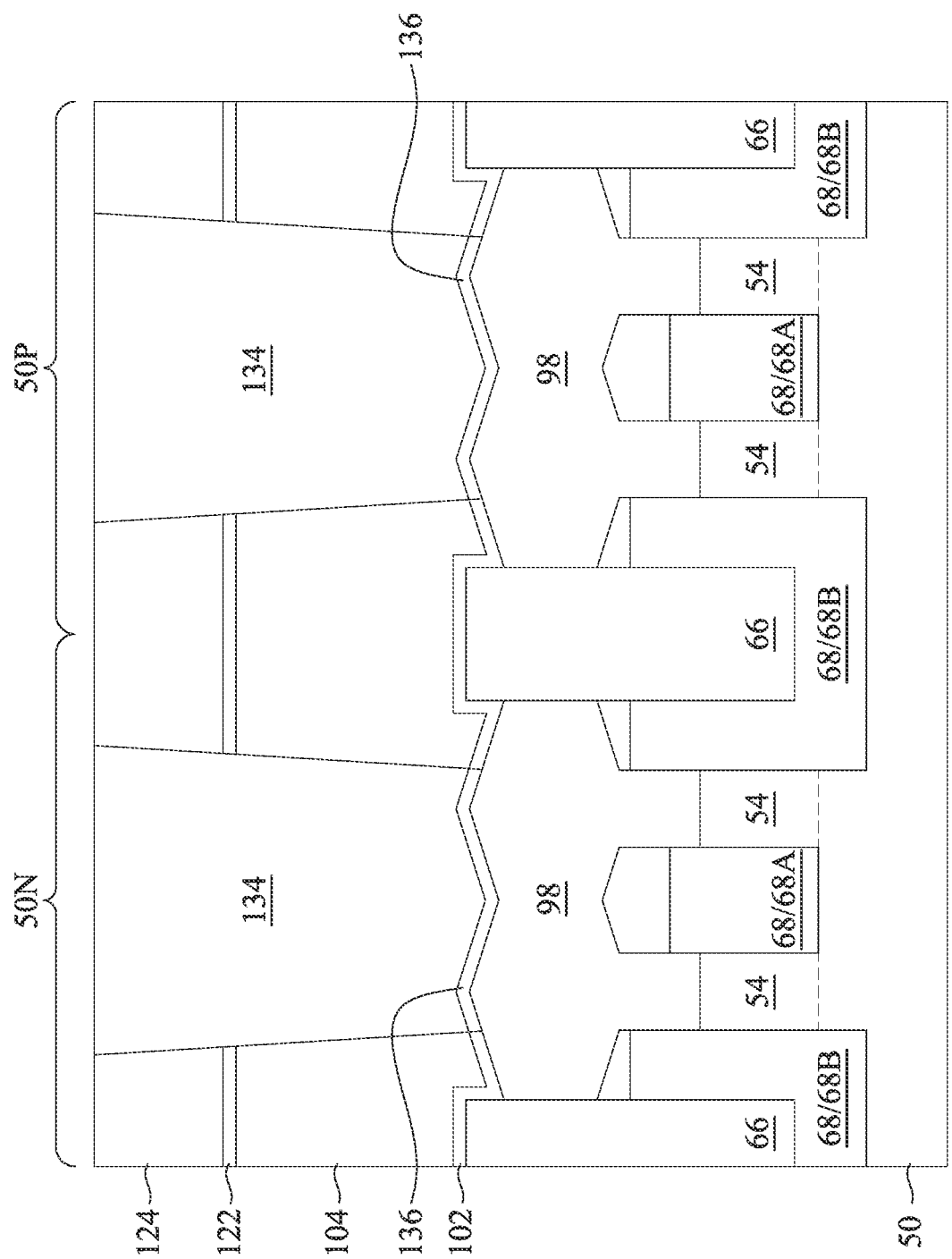

In FIGS. 17A-17C, gate contacts 132 and source/drain contacts 134 are formed to contact, respectively, the gate electrodes 114 and the epitaxial source/drain regions 98. The gate contacts 132 are physically and electrically coupled to the gate electrodes 114. The source/drain contacts 134 are physically and electrically coupled to the epitaxial source/drain regions 98.

As an example to form the gate contacts 132 and the source/drain contacts 134, openings for the gate contacts 132 are formed through the second ILD 124, the ESL 122, and the gate masks 116, and openings for the source/drain contacts 134 are formed through the second ILD 124, the ESL 122, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 124. The remaining liner and conductive material form the gate contacts 132 and the source/drain contacts 134 in the openings. The gate contacts 132 and the source/drain contacts 134 may be formed in distinct processes, or may be formed in the same process. Although shown as being formed in the same cross-sections, it should be appreciated that each of the gate contacts 132 and the source/drain contacts 134 may be formed in different cross-sections, which may avoid shorting of the contacts.

Optionally, metal-semiconductor alloy regions 136 are formed at the interfaces between the epitaxial source/drain regions 98 and the source/drain contacts 134. The metal-semiconductor alloy regions 136 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 136 can be formed before the material(s) of the source/drain contacts 134 by depositing a metal in the openings for the source/drain contacts 134 and then performing a thermal anneal process. The metal can be any metal capable of reacting with the semiconductor materials (e.g., silicon, silicon-germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 134, such as from surfaces of the metal-semiconductor alloy regions 136. The material(s) of the source/drain contacts 134 can then be formed on the metal-semiconductor alloy regions 136.

Figure 18:
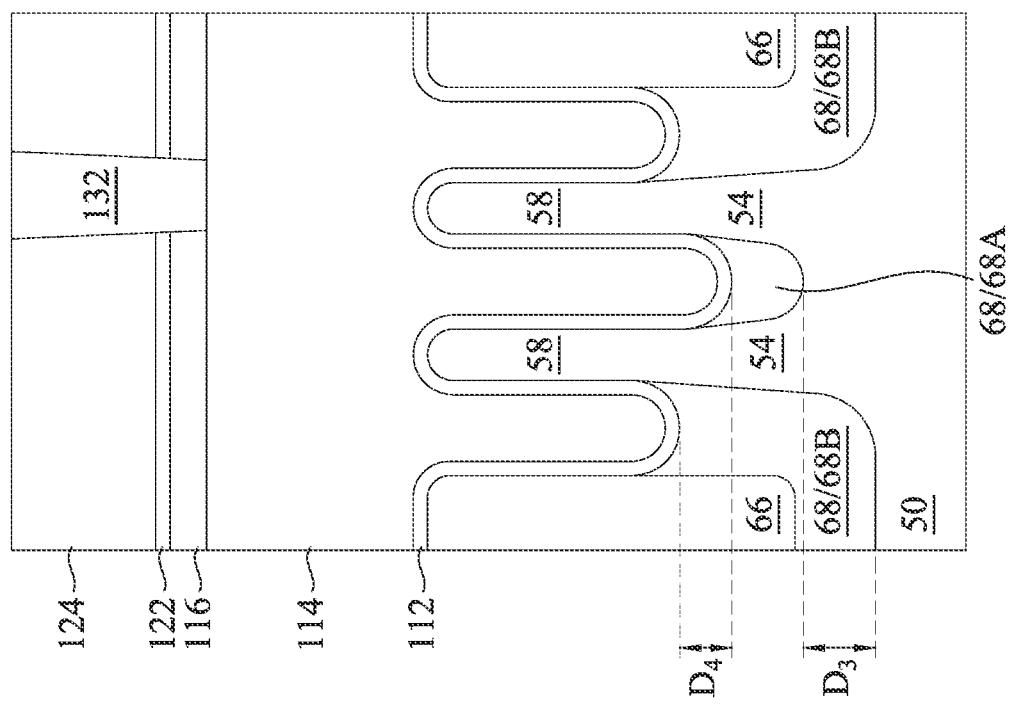
FIGS. 18 and 19 are views of FinFETs, in accordance with some other embodiments.

FIG. 18 illustrates a cross-sectional view of FinFETs, in accordance with an embodiment. The embodiment of FIG. 18 is similar to the embodiment of FIG. 17A, except the top surfaces of the STI regions 68 have concave top surfaces as a result of dishing during the etching of the insulation material 62 (described for FIG. 7). As more clearly shown, the difference in depth $D_4$ between the top surfaces of the STI regions 68A and the top surfaces of the STI regions 68B (also referred to as the step height of the STI regions 68) is measured between the vertexes of the convex surfaces. Further, the semiconductor fins 54 and the dielectric fins 66 have convex top surfaces as a result of etching losses during processing. Further yet, the dielectric fins 66 and the STI regions 68 have convex bottom surfaces as a result of contouring that may occur during the patterning of the semiconductor fins 54 (described for FIG. 3) and the deposition of the insulation material 62 (described for FIG. 4). As more clearly shown, the distance $D_3$ between the bottom surfaces of the STI regions 68A and the bottom surfaces of the STI regions 68B is measured between the vertexes of the convex surfaces.

Figure 19:
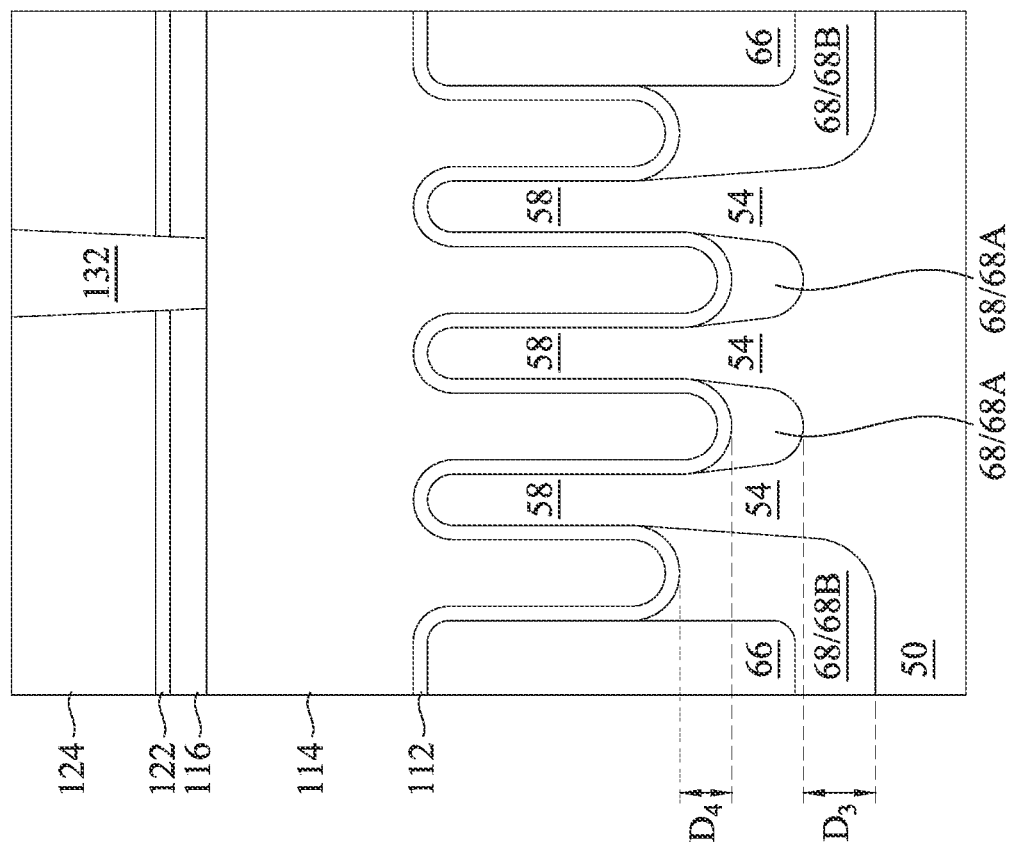

FIG. 19 illustrates a cross-sectional view of FinFETs, in accordance with various embodiments. The embodiment of FIG. 19 is similar to the embodiment of FIG. 18, except the fin structures 52 each have three semiconductor fins 54. Multiple STI regions 68A are disposed over each fin structure 52, with each STI region 68A disposed between two semiconductor fins 54 of the fin structure 52. In some embodiments, fin structures may have four or more semiconductor fins 54, with each STI region 68A disposed between two semiconductor fins 54 of the fin structure 52. The difference in depth $D_4$ between the top surfaces of the STI regions 68A and the top surfaces of the STI regions 68B (also referred to as the step height) is in a range of 2 nm to 5 nm, which is advantageous for reducing the bending of the outermost semiconductor fins 54 of the fin structures 52 neighboring the dielectric fins 66.

Embodiments may achieve advantages. Forming the insulation material 62 with different concentrations of an impurity as previously described helps form the STI regions 68 with a desired step height. Forming the STI regions 68 to have a desired step height helps avoid bending of the semiconductor fins 54. Avoiding bending of the semiconductor fins 54 increases the processing window for subsequent operations, such as a replacement gate process or a source/drain growth process. Manufacturing yield of the devices may thus be improved.

The disclosed FinFET embodiments could also be applied to nanostructure devices such as nanostructure (e.g., nanosheet, nanowire, gate-all-around, or the like) field-effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments.

Further, the FinFET/NSFET devices may be interconnected by metallization layers in an overlying interconnect structure to form integrated circuits. The overlying interconnect structure can be formed in a back end of line (BEOL) process, in which the metallization layers are connected to the gate contacts 132 and the source/drain contacts 134. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

In accordance with an embodiment, a device includes: a first semiconductor fin extending from a substrate; a dielectric fin over the substrate; a first isolation region between the first semiconductor fin and the dielectric fin, the first isolation region having a first concentration of an impurity; a second semiconductor fin extending from the substrate, the first semiconductor fin disposed between the second semiconductor fin and the dielectric fin; and a second isolation region between the first semiconductor fin and the second semiconductor fin, the second isolation region having a second concentration of the impurity, the second concentration being less than the first concentration, a top surface of the second isolation region disposed closer to the substrate than a top surface of the first isolation region. In an embodiment, the impurity is nitrogen. In an embodiment, a difference between the first concentration and the second concentration is in a range of 1 at % to 2 at %. In an embodiment, the top surface of the first isolation region and the substrate are separated by a first distance, the top surface of the second isolation region and the substrate are separated by a second distance, and a difference between the first distance and the second distance is in a range of 2 nm to 5 nm. In an embodiment, the first semiconductor fin and the second semiconductor fin have a first pitch measured between the first semiconductor fin and the second semiconductor fin at a depth 5 nm below respective top surfaces of the first semiconductor fin and the second semiconductor fin, the first semiconductor fin and the second semiconductor fin have a second pitch measured between the first semiconductor fin and the second semiconductor fin at a depth 60 nm below respective top surfaces of the first semiconductor fin and the second semiconductor fin, and a difference between the second pitch and the first pitch is in a range of 0 nm to 2.5 nm. In an embodiment, the first concentration is less than 1 at %. In an embodiment, the second concentration is in a range of 1 at % to 5 at %.

In accordance with another embodiment, a device includes: a first shallow trench isolation (STI) region over a substrate, the first STI region having a first concentration of nitrogen; a second STI region over the substrate, the second STI region having a second concentration of nitrogen, the second concentration being greater than the first concentration; and a first semiconductor fin extending from the substrate, the first semiconductor fin being disposed between the first STI region and the second STI region, a top surface of the first STI region disposed a first depth below a top surface of the first semiconductor fin, a top surface of the second STI region disposed a second depth below the top surface of the first semiconductor fin, the second depth being smaller than the first depth. In an embodiment, the first concentration of nitrogen is less than 1 at %. In an embodiment, the second concentration of nitrogen is greater than the first concentration of nitrogen by a difference in a range of 1 at % to 2 at %. In an embodiment, the second depth is smaller than the first depth by a difference in a range of 2 nm to 5 nm. In an embodiment, the device further includes a dielectric fin extending from the second STI region.

In accordance with yet another embodiment, a method includes: forming a first semiconductor fin and a second semiconductor fin extending from a substrate; forming a first insulating region and a second insulating region, the first insulating region being between the first semiconductor fin and the second semiconductor fin, the second semiconductor fin being between the first insulating region and the second insulating region; modifying the second insulating region by decreasing an etch rate of the second insulating region relative an etching process, wherein after modifying the second insulating region, the etch rate of the second insulating region is less than an etch rate of the first insulating region relative the etching process; forming a dielectric fin on the second insulating region; and recessing the first insulating region and the second insulating region by performing the etching process, a top surface of the first insulating region being recessed a greater depth than a top surface of the second insulating region. In an embodiment, modifying the second insulating region includes: increasing a concentration of an impurity in the second insulating region, wherein after modifying the second insulating region, the concentration of the impurity in the second insulating region is greater than a concentration of the impurity in the first insulating region. In an embodiment, the impurity is nitrogen. In an embodiment, forming the first insulating region and the second insulating region includes depositing a first insulation material over the first semiconductor fin and the second semiconductor fin. In an embodiment, modifying the second insulating region includes: forming a second insulation material over the first insulation material, the second insulation material having a greater concentration of an impurity than the first insulation material; and annealing the first insulation material and the second insulation material, wherein the annealing drives more of the impurity from the second insulation material into the second insulating region than into the first insulating region. In an embodiment, after annealing the first insulation material, a concentration of the impurity in the first insulating material is less than 1%. In an embodiment, the top surface of the first insulating region is recessed to a greater depth than the top surface of the second insulating region in a range of 2 nm to 5 nm. In an embodiment, forming the first insulating region and forming the second insulating region includes depositing silicon oxide, and the etching process is an oxide removal process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first semiconductor fin extending from a substrate;
    a dielectric fin over the substrate;
    a first isolation region between the first semiconductor fin and the dielectric fin, the first isolation region having a first concentration of an impurity;
    a second semiconductor fin extending from the substrate, the first semiconductor fin disposed between the second semiconductor fin and the dielectric fin; and
    a second isolation region between the first semiconductor fin and the second semiconductor fin, the second isolation region having a second concentration of the impurity, the second concentration being less than the first concentration, a top surface of the second isolation region disposed closer to the substrate than a top surface of the first isolation region.

2. The device of claim 1, wherein the impurity is nitrogen.

3. The device of claim 1, wherein a difference between the first concentration and the second concentration is in a range of 1 at % to 2 at %.

4. The device of claim 1, wherein the top surface of the first isolation region and the substrate are separated by a first distance, the top surface of the second isolation region and the substrate are separated by a second distance, and a difference between the first distance and the second distance is in a range of 2 nm to 5 nm.

5. The device of claim 1, wherein the first semiconductor fin and the second semiconductor fin have a first pitch measured between the first semiconductor fin and the second semiconductor fin at a depth 5 nm below respective top surfaces of the first semiconductor fin and the second semiconductor fin, the first semiconductor fin and the second semiconductor fin have a second pitch measured between the first semiconductor fin and the second semiconductor fin at a depth 60 nm below respective top surfaces of the first semiconductor fin and the second semiconductor fin, and a difference between the second pitch and the first pitch is in a range of 0 nm to 2.5 nm.

6. The device of claim 1, wherein the first concentration is less than 1 at %.

7. The device of claim 1, wherein the second concentration is in a range of 1 at % to 5 at %.

8. A device comprising:
a first shallow trench isolation (STI) region over a substrate, the first STI region having a first concentration of nitrogen;
a second STI region over the substrate, the second STI region having a second concentration of nitrogen, the second concentration being greater than the first concentration; and
a first semiconductor fin extending from the substrate, the first semiconductor fin being disposed between the first STI region and the second STI region, a top surface of the first STI region disposed a first depth below a top surface of the first semiconductor fin, a top surface of the second STI region disposed a second depth below the top surface of the first semiconductor fin, the second depth being smaller than the first depth.

9. The device of claim 8, wherein the first concentration of nitrogen is less than 1 at %.

10. The device of claim 8, wherein the second concentration of nitrogen is greater than the first concentration of nitrogen by a difference in a range of 1 at % to 2 at %.

11. The device of claim 8, wherein the second depth is smaller than the first depth by a difference in a range of 2 nm to 5 nm.

12. The device of claim 8, further comprising a dielectric fin extending from the second STI region.

13. A method comprising:
forming a first semiconductor fin and a second semiconductor fin extending from a substrate;
forming a first insulating region and a second insulating region, the first insulating region being between the first semiconductor fin and the second semiconductor fin, the second semiconductor fin being between the first insulating region and the second insulating region;
modifying the second insulating region by decreasing an etch rate of the second insulating region relative an etching process, wherein after modifying the second insulating region, the etch rate of the second insulating region is less than an etch rate of the first insulating region relative the etching process;
forming a dielectric fin on the second insulating region; and
recessing the first insulating region and the second insulating region by performing the etching process, a top surface of the first insulating region being recessed a greater depth than a top surface of the second insulating region.

14. The method of claim 13, wherein modifying the second insulating region comprises:
increasing a concentration of an impurity in the second insulating region, wherein after modifying the second insulating region, the concentration of the impurity in the second insulating region is greater than a concentration of the impurity in the first insulating region.

15. The method of claim 14, wherein the impurity is nitrogen.

16. The method of claim 13, wherein forming the first insulating region and the second insulating region comprises depositing a first insulation material over the first semiconductor fin and the second semiconductor fin.

17. The method of claim 16, wherein modifying the second insulating region comprises:
forming a second insulation material over the first insulation material, the second insulation material having a greater concentration of an impurity than the first insulation material; and
annealing the first insulation material and the second insulation material, wherein the annealing drives more of the impurity from the second insulation material into the second insulating region than into the first insulating region.

18. The method of claim 17, wherein after annealing the first insulation material, a concentration of the impurity in the first insulation material is less than 1%.

19. The method of claim 13, wherein the top surface of the first insulating region is recessed to a greater depth than the top surface of the second insulating region in a range of 2 nm to 5 nm.

20. The method of claim 13, wherein forming the first insulating region and forming the second insulating region comprises depositing silicon oxide, and the etching process is an oxide removal process.

* * * * *